United States Patent
Chang et al.

(10) Patent No.: US 12,500,219 B2
(45) Date of Patent: Dec. 16, 2025

(54) TRIMMING AND SAWING PROCESSES IN THE FORMATION OF WAFER-FORM PACKAGES

(71) Applicant: Taiwan Semiconductor Manufacturing Co., Ltd., Hsinchu (TW)

(72) Inventors: Mao-Yen Chang, Kaohsiung (TW); Yu-Chia Lai, Zhunan Township (TW); Kuo-Lung Pan, Hsinchu (TW); Cheng-Shiuan Wong, Hsinchu (TW); Hsiu-Jen Lin, Zhubei (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 625 days.

(21) Appl. No.: 17/655,835

(22) Filed: Mar. 22, 2022

(65) Prior Publication Data

US 2023/0178536 A1    Jun. 8, 2023

Related U.S. Application Data

(60) Provisional application No. 63/286,616, filed on Dec. 7, 2021.

(51) Int. Cl.
*H01L 25/00* (2006.01)
*H01L 21/56* (2006.01)
(Continued)

(52) U.S. Cl.
CPC ........... *H01L 25/50* (2013.01); *H01L 21/568* (2013.01); *H01L 21/6836* (2013.01);
(Continued)

(58) Field of Classification Search
CPC ... H01L 25/50; H01L 21/568; H01L 21/6836; H01L 24/16; H01L 24/19; H01L 24/20;
(Continued)

(56) References Cited

U.S. PATENT DOCUMENTS 11,004,803 B2   5/2021   Yu et al.
11,101,176 B2   8/2021   Wang et al.
(Continued)

FOREIGN PATENT DOCUMENTS

CN    113517203 A      10/2021
CN    117174598 A  *  12/2023   ........... H01L 21/308
(Continued)

*Primary Examiner* — Bac H Au
(74) *Attorney, Agent, or Firm* — Slater Matsil, LLP

(57) ABSTRACT

A method includes forming a reconstructed wafer, which includes placing a plurality of device dies over a carrier, encapsulating the plurality of device dies in an encapsulant, and forming a redistribution structure over the plurality of device dies and the encapsulant. The redistribution structure includes a plurality of dielectric layers and a plurality of redistribution lines in the plurality of dielectric layers. The method further includes performing a trimming process on the reconstructed wafer. The trimming process forms a round edge for the reconstructed wafer. A sawing process is performed on the reconstructed wafer, so that the reconstructed wafer includes straight edges.

20 Claims, 32 Drawing Sheets

(51) Int. Cl.
 *H01L 21/683* (2006.01)
 *H01L 23/00* (2006.01)
 *H01L 25/065* (2023.01)
(52) U.S. Cl.
 CPC .............. *H01L 24/16* (2013.01); *H01L 24/19* (2013.01); *H01L 24/20* (2013.01); *H01L 24/81* (2013.01); *H01L 25/0652* (2013.01); *H01L 25/0655* (2013.01); H01L 24/32 (2013.01); H01L 24/73 (2013.01); H01L 24/83 (2013.01); H01L 2224/16146 (2013.01); H01L 2224/2105 (2013.01); H01L 2224/32245 (2013.01); H01L 2224/73267 (2013.01)
(58) Field of Classification Search
 CPC . H01L 24/81; H01L 25/0652; H01L 25/0655; H01L 21/56; H01L 24/97; H01L 21/6835; H01L 24/96
 See application file for complete search history.

(56) References Cited

U.S. PATENT DOCUMENTS

| | | | |
|---|---|---|---|
| 11,296,062 | B2 | 4/2022 | Yu et al. |
| 11,658,164 | B2 | 5/2023 | Yu et al. |
| 11,705,323 | B2 | 7/2023 | Ahn et al. |
| 11,908,706 | B2 | 2/2024 | Yu et al. |
| 12,199,080 | B2 | 1/2025 | Yu et al. |
| 2014/0024170 | A1* | 1/2014 | Kuo ................... H01L 27/14687 257/E31.11 |
| 2018/0138164 | A1* | 5/2018 | Lee ................... H01L 21/76898 |
| 2019/0006197 | A1* | 1/2019 | Du ........................ H01L 24/02 |
| 2020/0006241 | A1* | 1/2020 | Wu ...................... H01L 21/6835 |
| 2020/0006308 | A1* | 1/2020 | Kuo ..................... H01L 23/5226 |
| 2020/0075447 | A1 | 3/2020 | Wang et al. |
| 2021/0078101 | A1 | 3/2021 | Sandoh |
| 2021/0078204 | A1 | 3/2021 | Fukazawa et al. |
| 2021/0302205 | A1 | 9/2021 | Essenmacher |
| 2021/0305200 | A1* | 9/2021 | Lin ....................... B23K 26/362 |
| 2021/0320000 | A1* | 10/2021 | Ahn ........................ B24B 9/065 |
| 2022/0336361 | A1* | 10/2022 | Yu .......................... H01L 24/19 |
| 2022/0367407 | A1* | 11/2022 | Lin ...................... H01L 21/31105 |
| 2023/0069311 | A1* | 3/2023 | Yeh ..................... H01L 21/4857 |
| 2024/0019486 | A1* | 1/2024 | Wu ......................... G01R 31/2891 |
| 2024/0113071 | A1* | 4/2024 | Liu .......................... H01L 24/32 |

FOREIGN PATENT DOCUMENTS

| | | |
|---|---|---|
| DE | 102019114212 A1 | 1/2020 |
| DE | 102019130466 A1 | 12/2020 |
| DE | 102020110287 A1 | 9/2021 |
| DE | 102020211449 A1 | 9/2021 |
| EP | 0180430 A2 | 5/1986 |
| KR | 20190114723 A | 10/2019 |
| KR | 20200003713 A | 1/2020 |
| KR | 20210125726 A | 10/2021 |
| TW | 202006838 A | 2/2020 |
| TW | 202111790 A | 3/2021 |

\* cited by examiner

TRIMMING AND SAWING PROCESSES IN THE FORMATION OF WAFER-FORM PACKAGES

PRIORITY CLAIM AND CROSS-REFERENCE

This application claims the benefit of the following provisionally filed U.S. patent application: Application No. 63/286,616, filed on Dec. 7, 2021, and entitled "Specific Trimming Process in Wafer-Form Package Chamber Application," which application is hereby incorporated herein by reference.

BACKGROUND

Wafer-form packages are used in high-performance applications such as Artificial Intelligence (AI) applications. In the wafer-form packages, multiple device dies may be packaged as a reconstructed wafer, in which redistribution lines are formed to interconnect the device dies. The reconstructed wafer is packaged without being sawed apart to separate the device dies from each other.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
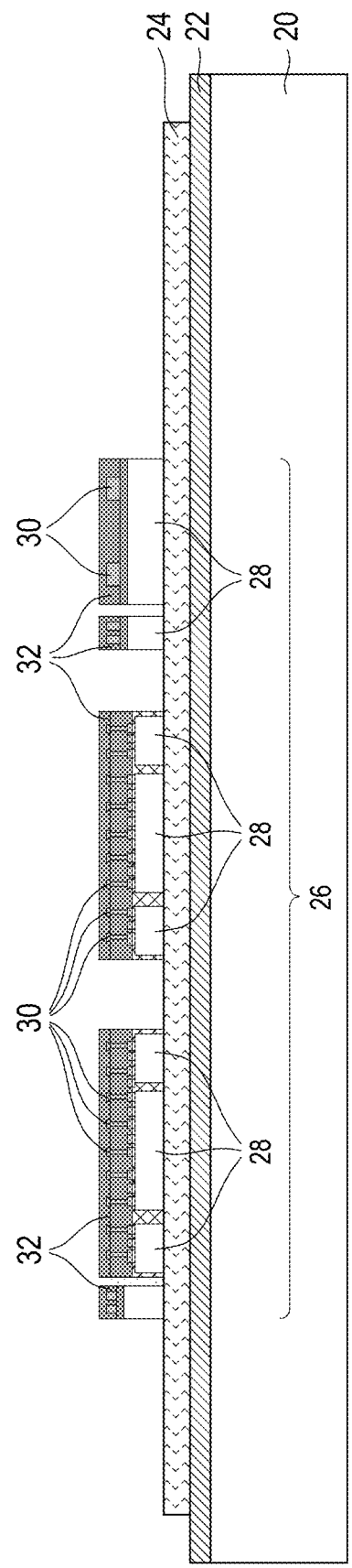
FIGS. 1-3, 4A, 4B, 5-6, 7A, 7B, 8-9, 10A, 10B, 11-12, 13A, 13B, and 13C illustrate the cross-sectional views and top views of intermediate stages in the formation of a wafer-form package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer-form package and the method of forming the same are provided in accordance with some embodiments. A reconstructed wafer is formed, and is trimmed, so that some edge portions of the reconstructed wafer are removed, and chamfers may possibly be formed. Round edges are also formed by the trimming process. The reconstructed wafer is also sawed to remove some edge portions and to form straight edges. By performing both of the sawing process and the trimming process, the size of the reconstructed wafer is reduced by the sawing process, and the trimming process may reduce the quality check issue. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-3, 4A, 4B, 5-6, 7A, 7B, 8-9, 10A, 10B, 11-12, 13A, 13B, and 13C illustrate the cross-sectional views of intermediate stages in the formation of wafer-form package in accordance with some embodiments of the present disclosure. The corresponding processes are also reflected schematically in the process flow shown in FIG. 26.

Referring to FIG. 1, carrier 20 is provided, and release film 22 is coated on carrier 20. Carrier 20 is formed of a transparent material, and may be a glass carrier, a ceramic carrier, an organic carrier, or the like. Release film 22 is in physical contact with the top surface of carrier 20. Release film 22 may be formed of a Light-To-Heat-Conversion (LTHC) coating material. Release film 22 may be applied onto carrier 20 through coating. In accordance with some embodiments of the present disclosure, the LTHC coating material is capable of being decomposed under the heat of light/radiation (such as a laser beam), and can release carrier 20 from the structure placed and formed thereon. Die-attach film 24, which is an adhesive film, is disposed on carrier 20.

Figure 26:
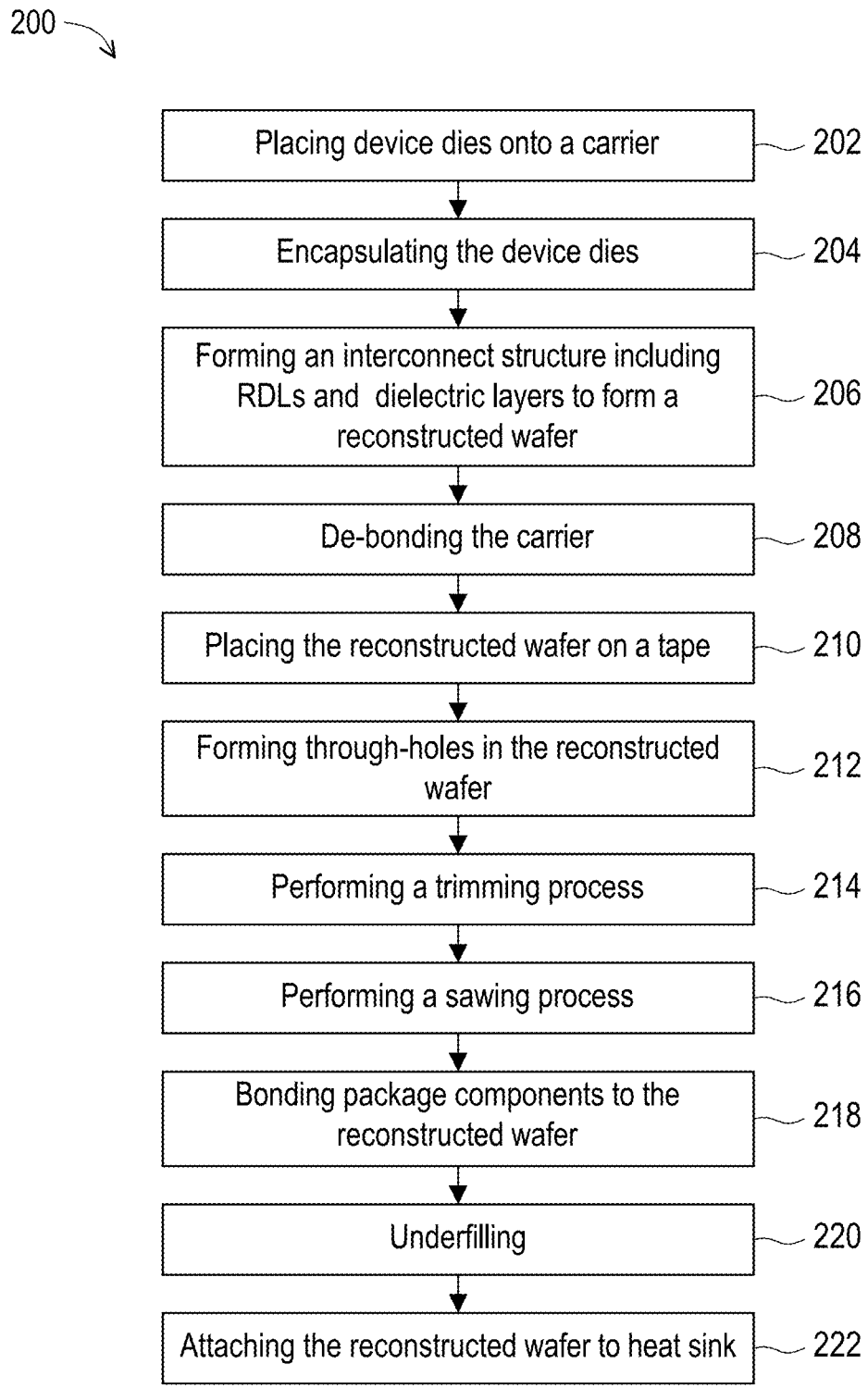
FIGS. 26 and 27 illustrate process flows for forming wafer-form packages in accordance with some embodiments.

FIG. 1 further illustrates the placement of package components 26, which are placed on, and attached to, DAF 24. The respective process is illustrated as process 202 in the process flow 200 as shown in FIG. 26. In accordance with some embodiments of the present disclosure, package components 26 include logic dies (such as computing dies), memory dies (such as Dynamic Random Access Memory (DRAM) dies or Static Random Access Memory (SRAM) dies), photonic dies, packages (including device dies that have already been packaged in), Input-output (IO) dies, digital dies, analog dies, surface-mount passive devices, die stacks such as High-Bandwidth Memory (HBM) blocks, or the like. Package components 26 may all be of the same type having an identical structure, or may include a plurality of different types of package components as aforementioned.

In accordance with some embodiments of the present disclosure, package components 26 include semiconductor substrates 28, which may be silicon substrates, germanium substrates, or III-V compound semiconductor substrates formed of, for example, GaAs, InP, GaN, InGaAs, InAlAs, etc. Integrated circuit devices (not shown) such as transistors, diodes, resistors, capacitors, inductors, or the like, may be formed at the surfaces of, or over, substrates 28. Interconnect structures such as metal lines and vias, which are formed in dielectric layers, are formed over and electrically coupling to the integrated circuit devices. Conductive pillars 30 are formed at the surfaces of the corresponding package components 26, and are electrically coupled to the integrated circuit devices in package components 26 through the interconnect structures. Protection layers 32 are formed to cover metal pillars 30. Protection layers 32 may be formed of a polymer such as polyimide, polybenzoxazole (PBO), or the like.

Figure 2:
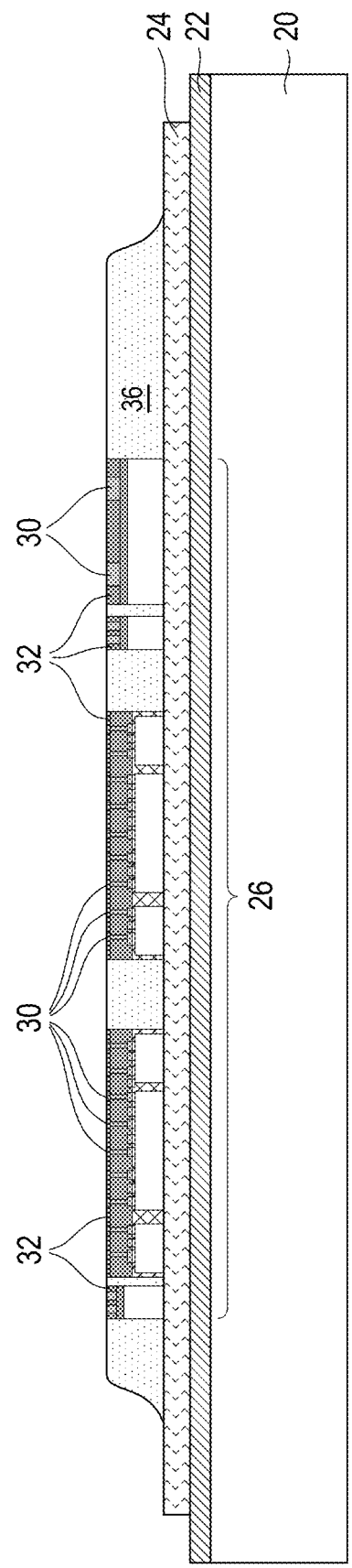

Referring to FIG. 2, encapsulant 36 is dispensed to encapsulate package components 26 and fill the gaps between package components 26. The respective process is illustrated as process 204 in the process flow 200 as shown in FIG. 26. Encapsulant 36 is then cured. Encapsulant 36 may include a molding compound, a molding underfill, an epoxy, and/or a resin. In accordance with some embodiments, encapsulant 36 includes a base material and filler particles in the base material. The base material may include a polymer, a resin, an epoxy, and/or the like. The filler particles may be formed of silicon oxide, aluminum oxide, or the like, which may have spherical shapes. Also, the spherical filler particles may have the same or different diameters.

Subsequent to the dispensing of encapsulant 36, a planarization process such as a Chemical Mechanical Polish (CMP) process or a mechanical grinding process is performed to planarize encapsulant 36, protection layers 32, and conductive pillars 30. As a result, conductive pillars 30 are exposed.

Figure 3:
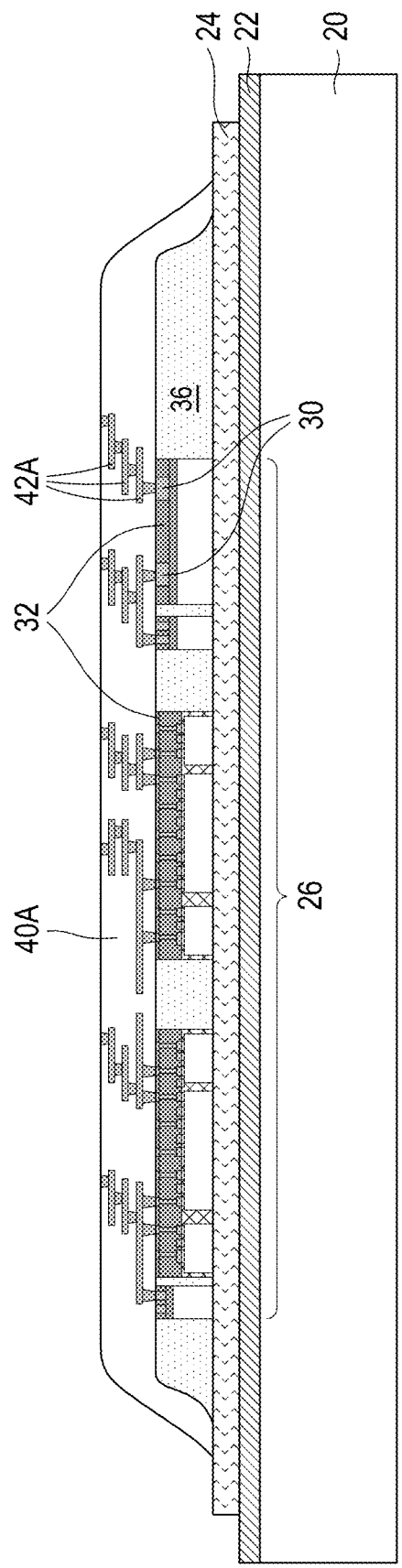
Figure 4A:
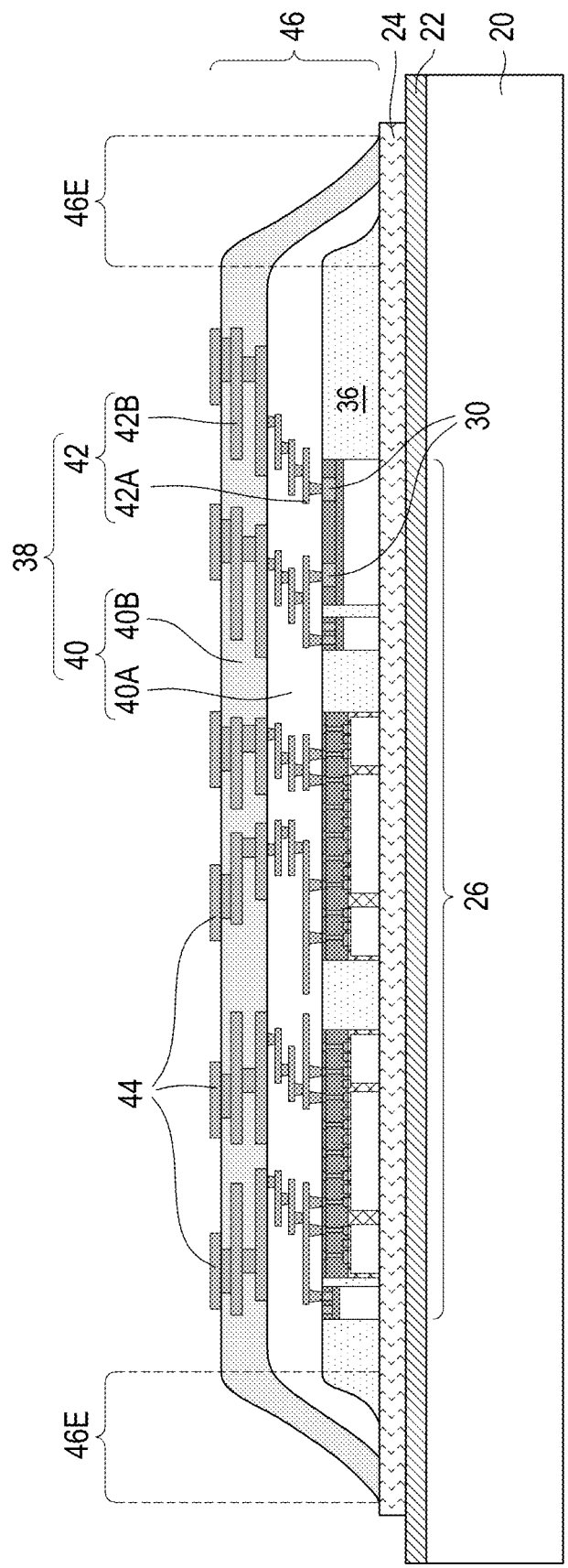

In subsequent processes, interconnect structure 38 is formed over encapsulant 36, as shown in FIGS. 3 and 4A, which illustrate the formation of a lower portion and an upper portion, respectively, of interconnect structure 38. The respective process is illustrated as process 206 in the process flow 200 as shown in FIG. 26. In accordance with some embodiments of the present disclosure, interconnect structure 38 includes dielectric layers 40A and dielectric layers 40B over dielectrics 40A, which are collectively referred to as dielectric layers 40. The boundaries of dielectric layers 40A and 40B are not shown. Each of the dielectric layers 40B may be thicker than any of the dielectric layers 40A.

In accordance with some embodiments of the present disclosure, dielectric layers 40A are formed of a photosensitive polymer(s) such as PBO, polyimide, BCB, or the like, and dielectric layers 40B are formed of a non-photosensitive material such as a molding compound(s), a molding underfill(s), silicon oxide, silicon nitride, or the like. In accordance with alternative embodiments, both of dielectric layers 40A and 40B are formed of photo-sensitive material(s). For example, all of dielectric layers 40 may be formed of photo-sensitive material(s) such as PBO, polyimide, BCB, or the like. The formation of each of dielectric layers 40A and 40B may include dispensing dielectric layer 40 in a flowable form, and then curing the dielectric layer 40.

RDLs 42A are formed in dielectric layers 40A, and RDLs 42B are formed in dielectric layers 40B. RDLs 42A and 42B are collectively referred to as RDLs 42. In accordance with some embodiments, RDLs 42B are thicker and/or wider than RDLs 42A, and may be used for long-range electrical routing, while RDLs 42A may be used for short-range electrical routing. Electrical connectors 44 are formed on the surface of interconnect structure 38. Electrical connectors 44 and RDLs 42A and 42B are electrically connected to, and interconnect, package components 26. Throughout the description, the components over release film 22 are collectively referred to as reconstructed wafer 46.

An example formation process of dielectric layers 40A and RDLs 42A are discussed as follows as an example. First, a first one of the dielectric layers 40A is deposited on the polished encapsulant 36 and package components 26, and is then patterned to form openings, through which the metal pillars 30 of package components 26 are exposed. The patterning process may be through a photo lithography process including light-exposing the dielectric layer 40A, and developing the dielectric layer 40A. Next, a metal seed layer is deposited, for example, through Physical Vapor Deposition (PVD). A plating mask, which may be a photo resist, is then formed on the patterned dielectric layer 40A, and is patterned. A plating process is then performed to form RDLs in the openings in the plating mask. The plating mask is then removed, followed by the etching of the underlying metal seed layer. An RDL layer is thus formed, which includes line portions of the corresponding dielectric layer 40A and via portions extending into dielectric layer 40A. This process may be repeated to form a plurality of dielectric layers 40A and the corresponding RDLs 42A.

An example formation process of dielectric layers 40B and RDLs 42B are discussed as follows as an example. First, a metal seed layer is deposited, followed by the formation and the patterning of a first plating mask, which may be a photo resist. A first plating process is then performed to plate RDLs. The first plating mask is then removed. Next, without etching the metal seed layer, a second plating mask is formed, which may be a photo resist. A second plating process is then performed to plate the vias on the RDLs. The second plating mask is then removed, followed by the etching of the underlying metal seed layer not covered by the RDLs. A layer of RDLs and an overlying layer of vias are thus formed. Next, a dielectric layer 40B, for example, a molding compound, is disposed and cured. A planarization process is then performed, so that the top surfaces of the vias are level with the top surface of the dielectric layer. This process may be repeated to form a plurality of dielectric layers 40B and the corresponding RDLs 42B.

Since encapsulant 36 and dielectric layers 40 are flowable, when dispensed, in the regions near the boundaries of reconstructed wafer 46, encapsulant 36 and dielectric layers 40 flow sideways, and form slanted and curved sidewalls. In accordance with some embodiments, dielectric layers 40A cover the sidewalls of encapsulant 36 (FIG. 3), and encapsulant 36 may be fully covered, or may have end portions exposed, with most of the sidewalls covered. Dielectric layers 40B cover the sidewalls of dielectric layer 40A (FIG. 4A), and dielectric layer 40A may be fully covered, or may have end portions exposed, with most of the sidewalls covered.

Figure 4B:
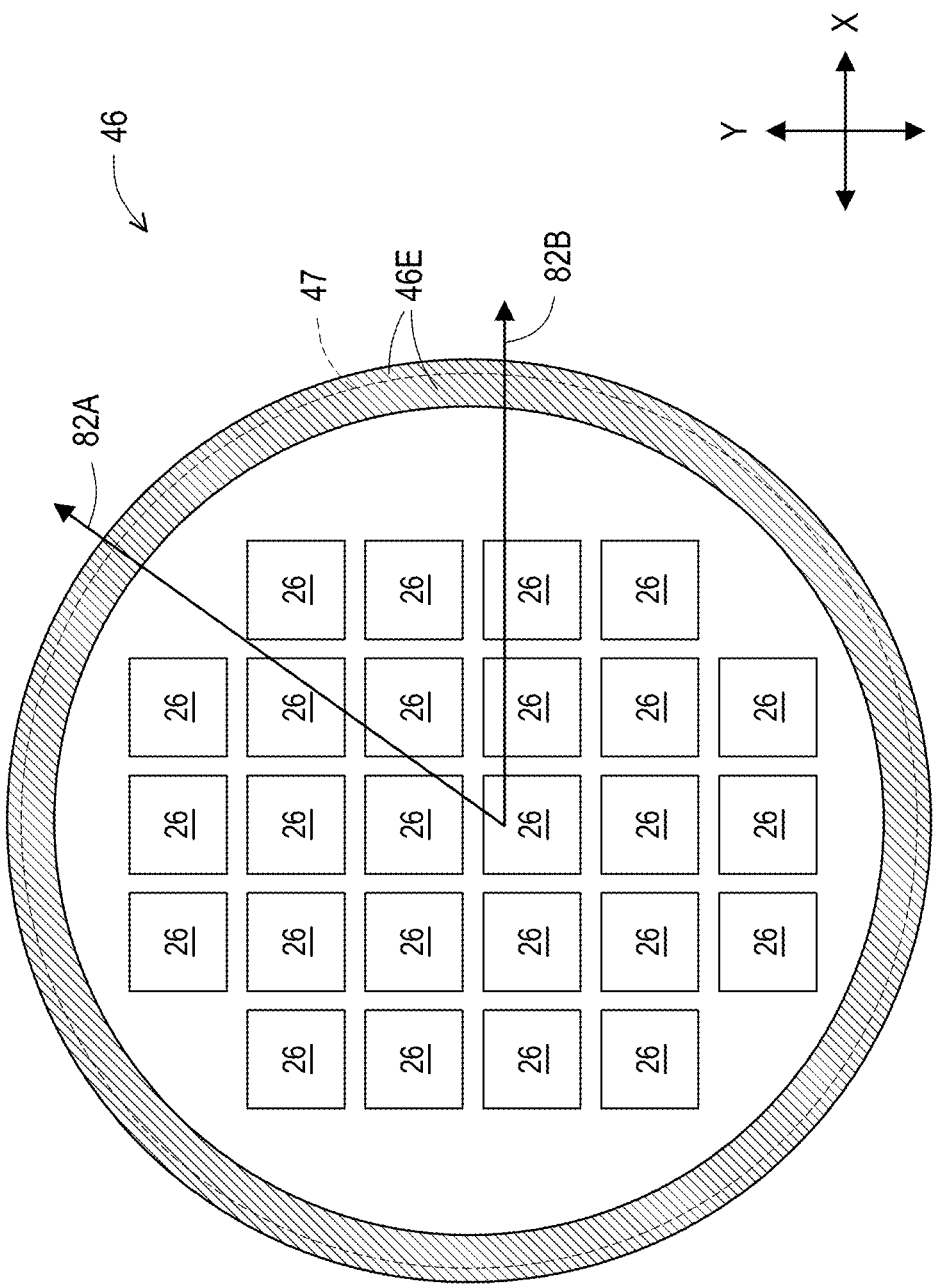

FIG. 4B illustrates a top view of reconstructed wafer 46, wherein example package components 26 are shown schematically, while RDLs 42 are not shown. Throughout the description, the edge portions of reconstructed wafer 46 are referred to as edge portions 46E, which form a ring encircling an inner portion of reconstructed wafer 46. The edge portions 46E are also marked in FIG. 4A.

Figure 5:
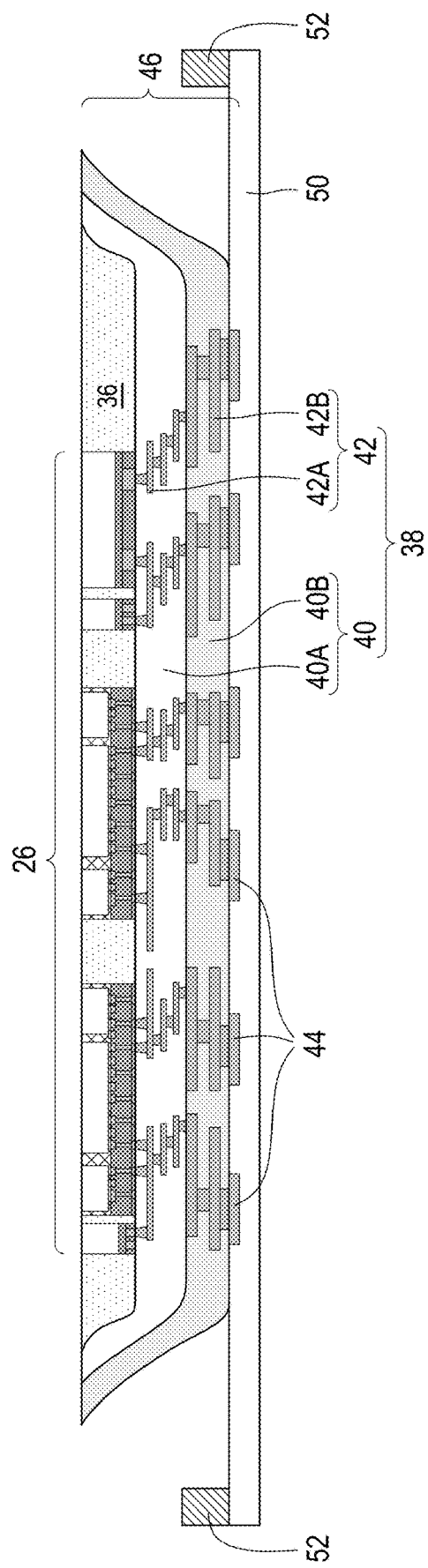

In a subsequent process, carrier 20 is de-bonded from reconstructed wafer 46. For example, by projecting a light beam (such as a laser beam) on release film 22, and the light beam penetrates through the transparent carrier 20. The respective process is illustrated as process 208 in the process flow 200 as shown in FIG. 26. The release film 22 is thus decomposed, and reconstructed wafer 46 is released from carrier 20. DAF 24 may be removed in a cleaning process or a grinding process. The resulting reconstructed wafer 46 is shown in FIG. 5.

In accordance with some embodiments, reconstructed wafer 46 is flipped upside down, and is placed on tape 50, which is fixed by frame 52. The respective process is illustrated as process 210 in the process flow 200 as shown in FIG. 26. In accordance with some embodiments, the electrical connectors 44 are in contact with tape 50. In accordance with alternative embodiments, package components 26 and encapsulant 36 are in contact with tape 50.

Figure 6:
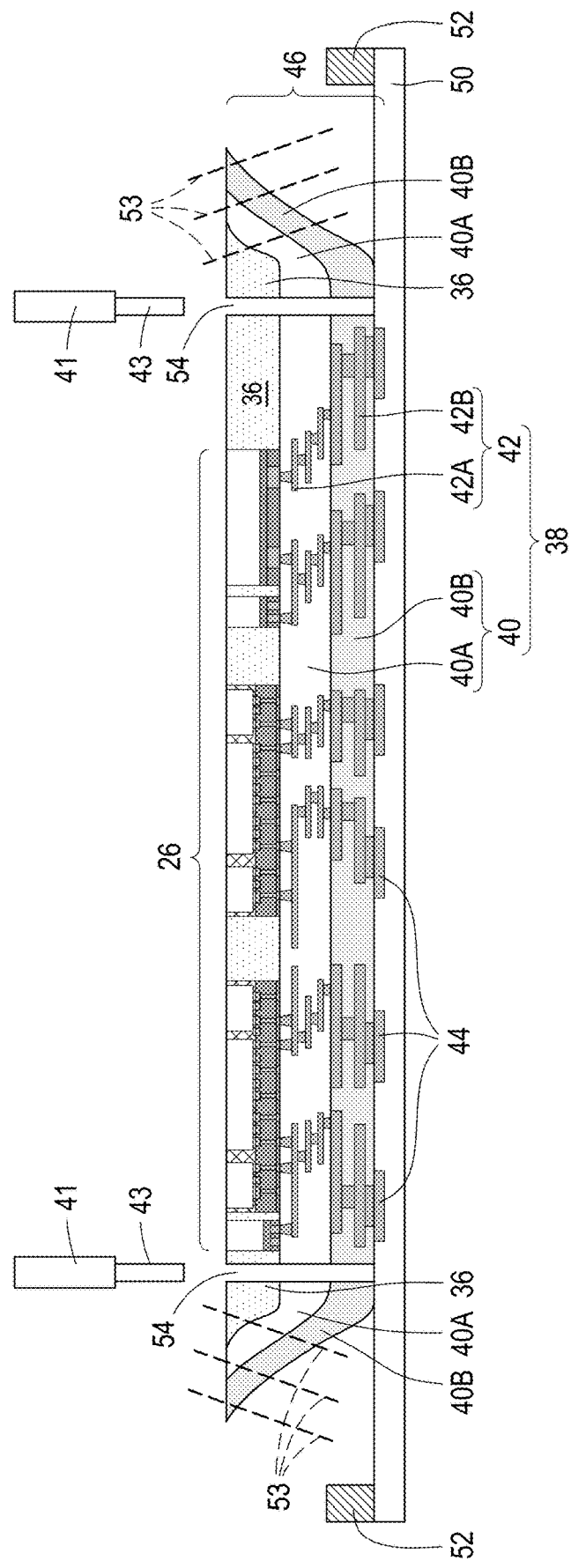
Figure 8:
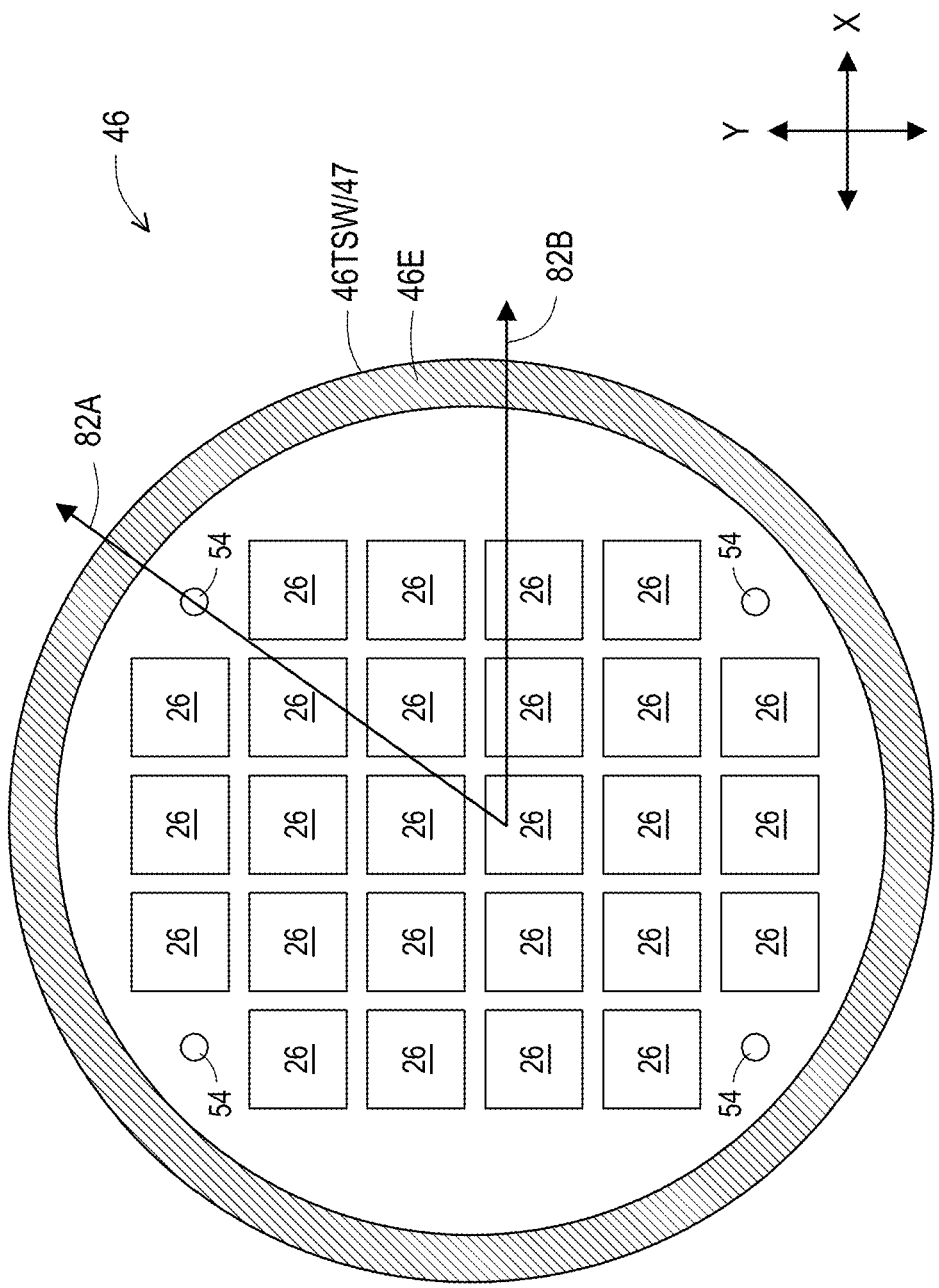

Referring to FIG. 6, through-holes 54 are formed to penetrate through reconstructed wafer 46. The respective process is illustrated as process 212 in the process flow 200 as shown in FIG. 26. Through-holes 54 may be formed through laser drill, drilling using a drill bit, or the like. For example, FIG. 6 schematically illustrates laser beam generator 41 and the generated laser beam 43. The features 41 and 43 may also represent a drilling bit. In accordance with some embodiments, package components 26 are distributed as an array including a plurality of rows and a plurality of columns. A plurality of horizontal spacings and a plurality of vertical spacings separate the row and the columns, respectively, from each other. Some of through-holes 54 are close to edges, as shown in FIG. 8. Some other through-holes 54 may also be located in the inner portions of reconstructed wafer 46 and at the overlapping areas of the horizontal spacings and the vertical spacings.

Figure 7A:
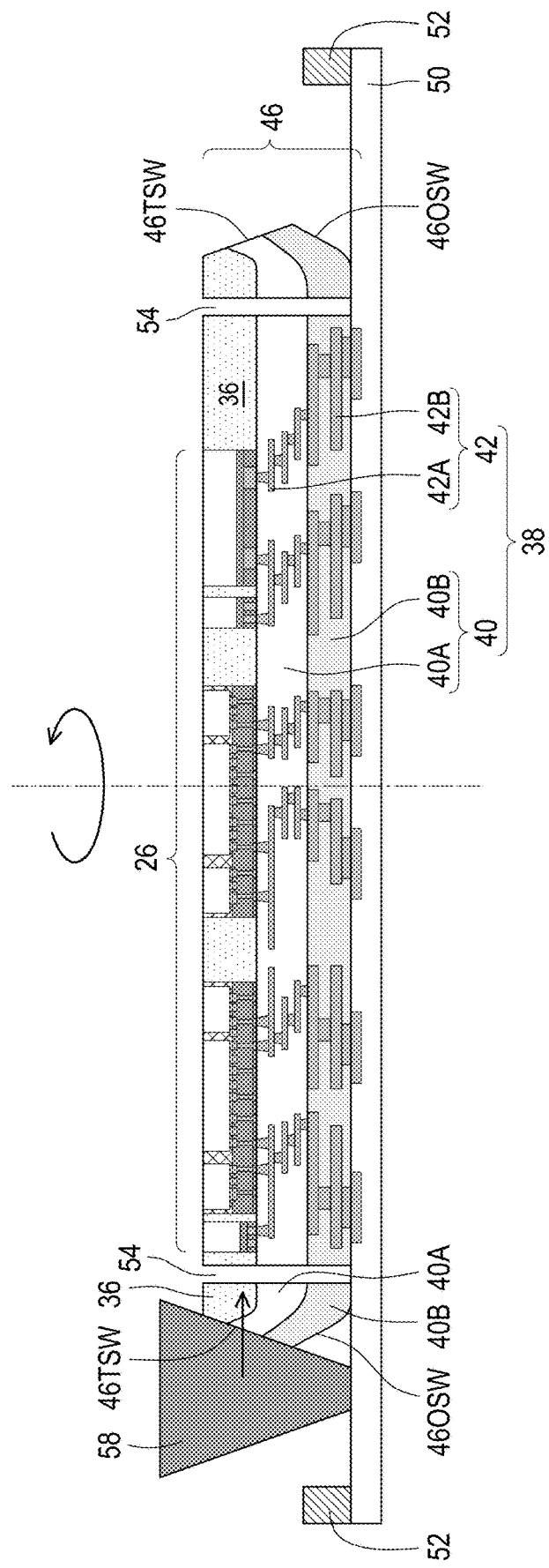
Figure 21:
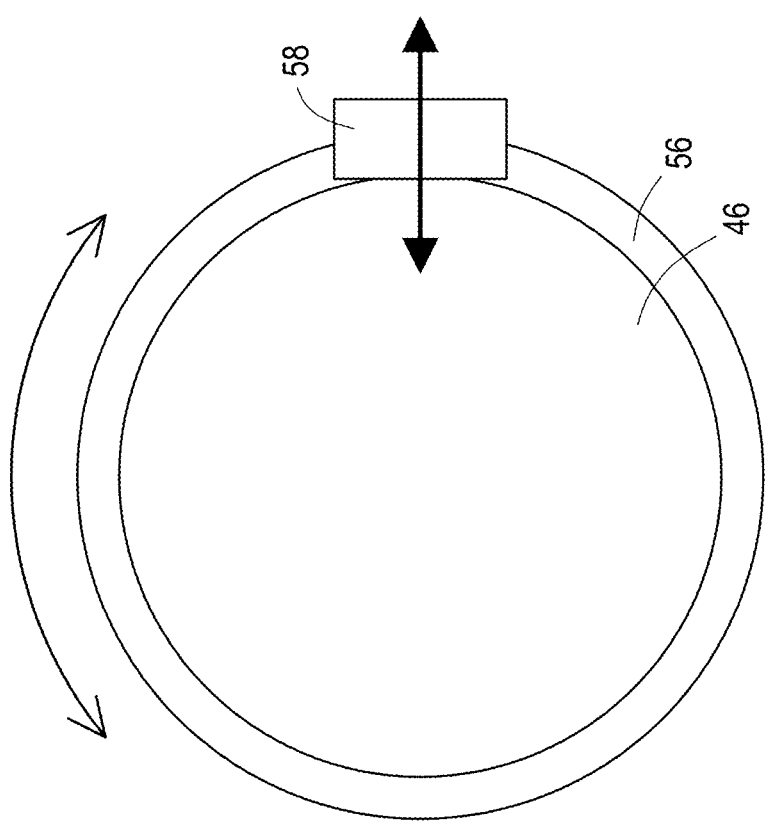
FIGS. 21 and 22 illustrate a top view and a perspective view in a trimming process in accordance with some embodiments.
Figure 22:
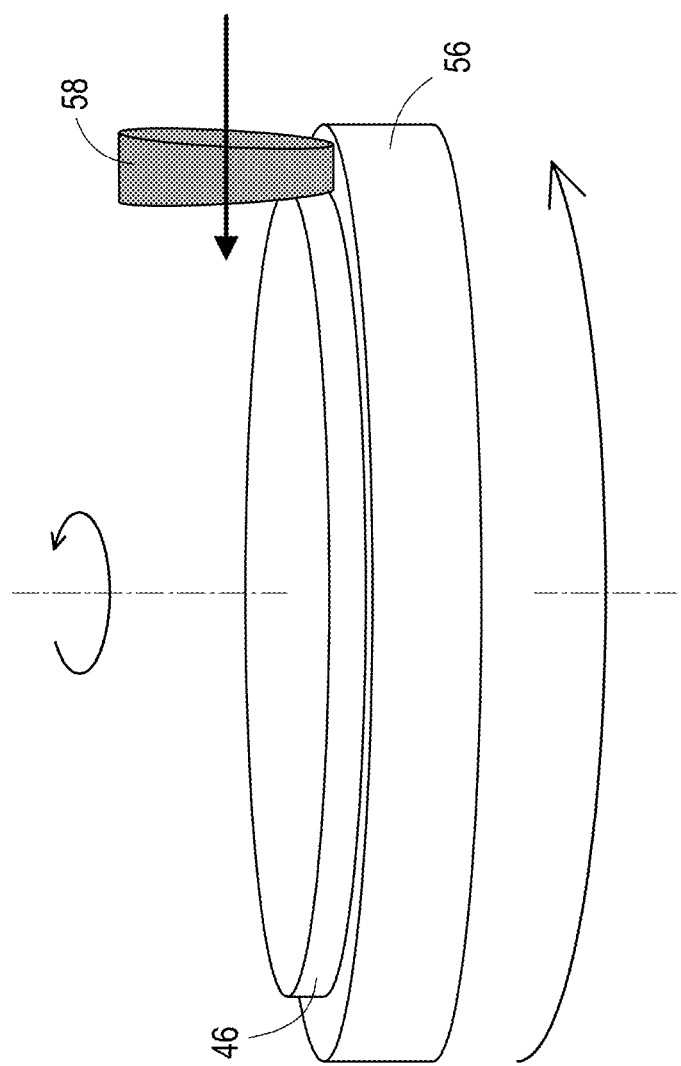

FIG. 7A illustrates a trimming process to trim the edge portions of reconstructed wafer 46. The respective process is illustrated as process 214 in the process flow 200 as shown in FIG. 26. FIGS. 21 and 22 illustrate a top view and a perspective view, respectively, in a trimming process. Referring to FIG. 21, reconstructed wafer 46 and the underlying tape 50 (not shown) are placed on chuck table 56. The chuck table 56 is rotated so that reconstructed wafer 46 is also rotated. Edge trimming blade 58 is moved toward the rotation axis, and is pressed laterally on the rotating reconstructed wafer 46. As a result, the edge portions of reconstructed wafer 46 is trimmed, and the edge of reconstructed wafer 46 is round and fits a circle. The portions of reconstructed wafer 46 removed by the trimming process may be within the edge portion 46E. For example, as shown in FIG. 4B, the edge of reconstructed wafer 46 may be recessed by the trimming process to the dashed circle 47 as shown in FIG. 4B. FIG. 8 illustrates an example top view of the trimmed reconstructed wafer 46, wherein the sidewall of reconstructed wafer 46 generated by the trimming process is shown as sidewall 46TSW.

Referring back to FIG. 7A, while edge trimming blade 58 is pushed laterally, it is kept still without being rotated. It is appreciated that chuck table 56 as shown in FIGS. 21 and 22 are not shown in FIG. 7A. In accordance with some embodiments, edge trimming blade 58 has a slanted sidewall. As a result, the sidewall 46TSW of the trimmed reconstructed wafer 46 is also slanted. Throughout the description, the sidewall 46TSW is also referred to as the chamfer of reconstructed wafer 46. In accordance with alternative embodiments, the edge trimming blade 58 has a vertical inner sidewall. As a result, the sidewall 46TSW of the trimmed reconstructed wafer 46 is also vertical.

In accordance with some embodiments, as shown in FIG. 7A, after the trimming process, the edge portions of both of dielectric layers 40A and 40B are removed partially, and some sidewalls of encapsulant 36 are generated and revealed. In accordance with alternative embodiments, after the trimming process, the edge portions of dielectric layers 40B have parts removed, but not enough to reveal dielectric layers 40A. Accordingly, after the trimming process, dielectric layers 40B still fully prevents dielectric layers 40A from being exposed from sides. In accordance with alternative embodiments, after the trimming process, the edge portions of dielectric layers 40A and 40B both have parts being removed, but not enough to reveal encapsulant 36. The dashed lines 53 in FIG. 6 are shown in FIG. 6 to illustrate the possible positions where the trimming process is ended.

Figure 23:
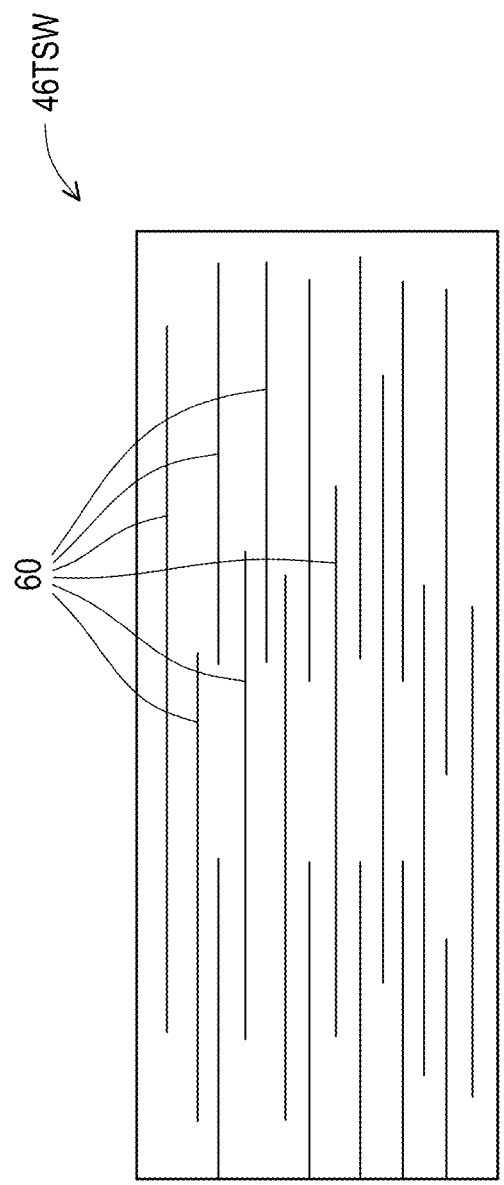
FIG. 23 illustrates trimming marks (traces) on a wafer sidewall formed by a trimming process in accordance with some embodiments.

FIG. 23 illustrates a front view of sidewall 46TSW, which is generated as a result of the trimming process. Since reconstructed wafer 46 is rotated in the trimming process, there are marks/traces 60 left on the sidewall 46TSW, which marks 60 are the micro recesses and/or micro protrusions on sidewall 46TSW. For example, some traces 60 are the results of the grits on the surface of edge trimming blade 58 (FIGS. 21 and 22), which grits are used for polishing reconstructed wafer 46. The traces 60 are horizontal and parallel to each other, and are parallel to the top surface of reconstructed wafer 46. Furthermore, there may not be traces extending in other directions that are not parallel to traces 60. On the other hand, referring to FIG. 7A, the sidewalls 460SW, which are original sidewalls of reconstructed wafer 46, do not have traces therein.

Figure 7B:
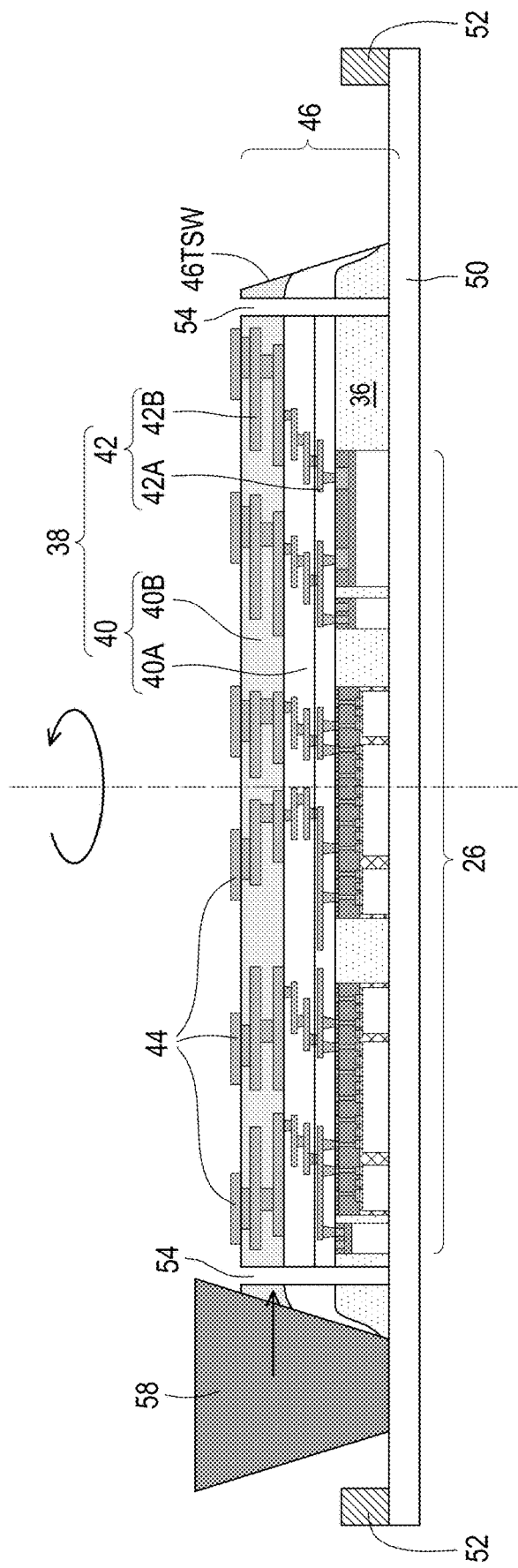

In accordance with alternative embodiments, as shown in FIG. 7B, the reconstructed wafer 46 released from carrier 20 is placed on tape 50 in an orientation opposite to the orientation as shown in FIG. 7A. Accordingly, the bottom surface of encapsulant 36, rather than electrical connectors 44, is in contact with tape 50. Next, a trimming process is performed on reconstructed wafer 46. Again, the trimming process may be performed using a same process as discussed referring to FIGS. 21 and 22. After the trimming process, dielectric layers 40A may be or may not be revealed. Encapsulant 36 also may be, or may not be, revealed. FIG. 8 illustrates an example top view of the trimmed reconstructed wafer 46.

Figure 9:
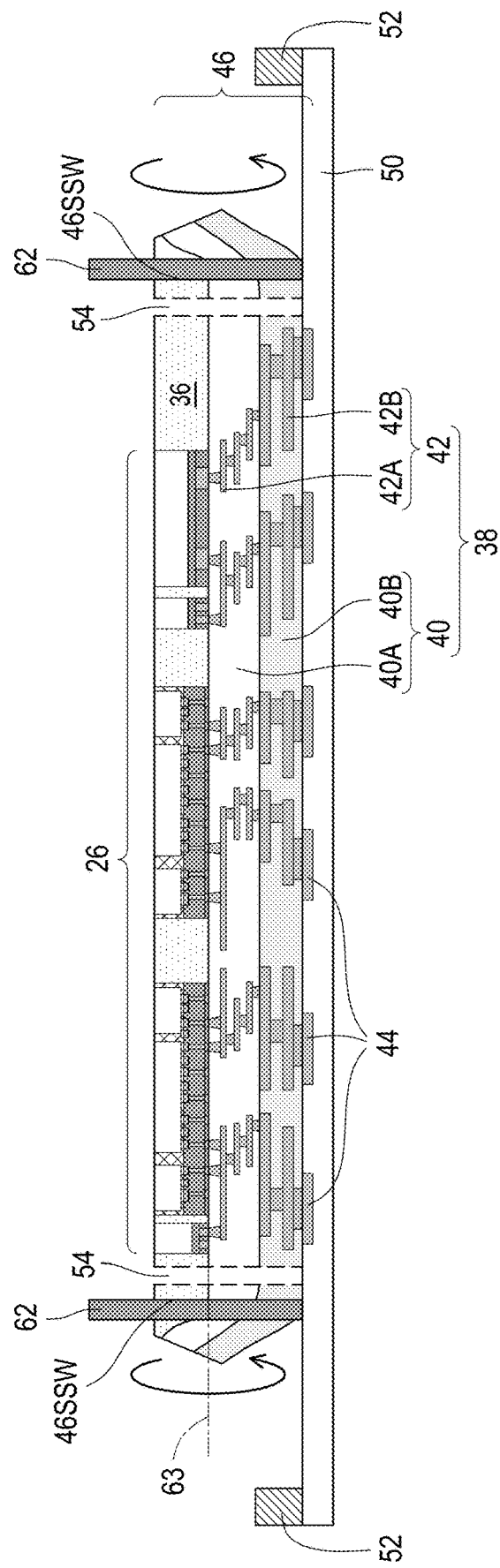
Figure 24:
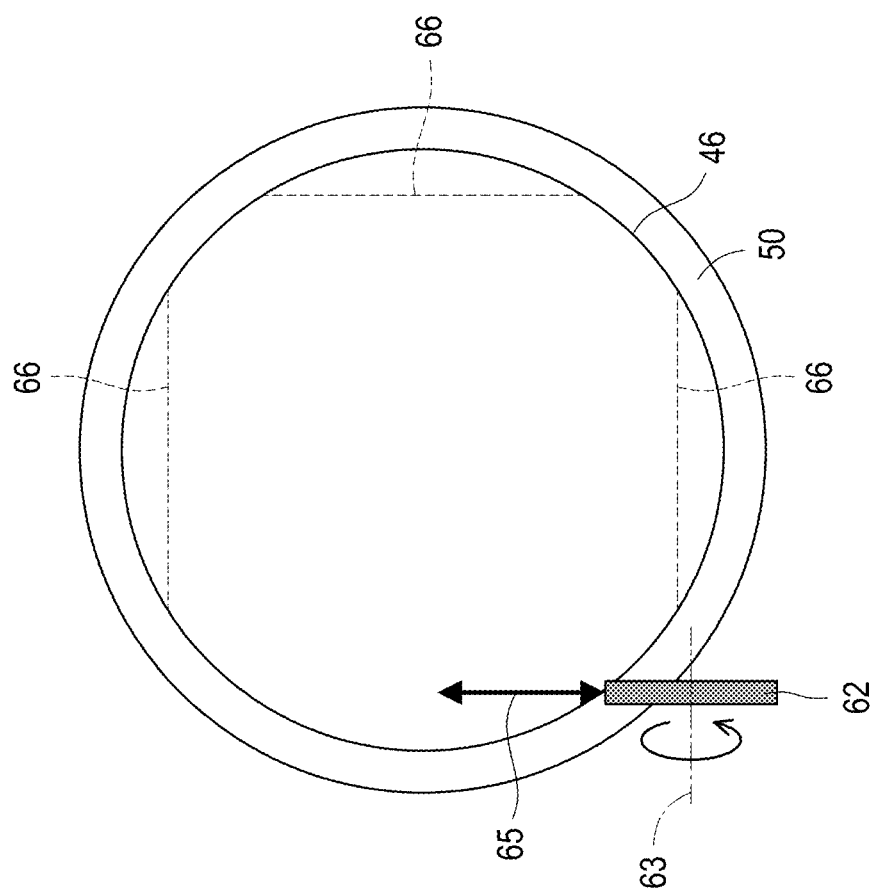
FIG. 24 illustrates a top view in a sawing process in accordance with some embodiments.

FIG. 9 illustrates an edge-sawing process to remove some edge portions of reconstructed wafer 46. The respective process is illustrated as process 216 in the process flow 200 as shown in FIG. 26. Through-holes 54 are illustrated as being dashed since in the illustrated example, through-holes 54 may not be (although they can also be) in the cross-section as shown in FIG. 9. FIG. 24 illustrates a top view in an edge-sawing process. In the edge-sawing process, reconstructed wafer 46 is kept still, and is not rotated. A sawing blade 62 is used to saw reconstructed wafer 46. Sawing blade 62 is rotated around axis 63, and in the meantime moves in the direction as shown by arrow 65. As a result, a left edge-piece on the left side of sawing blade 62 is removed.

Figure 13A:
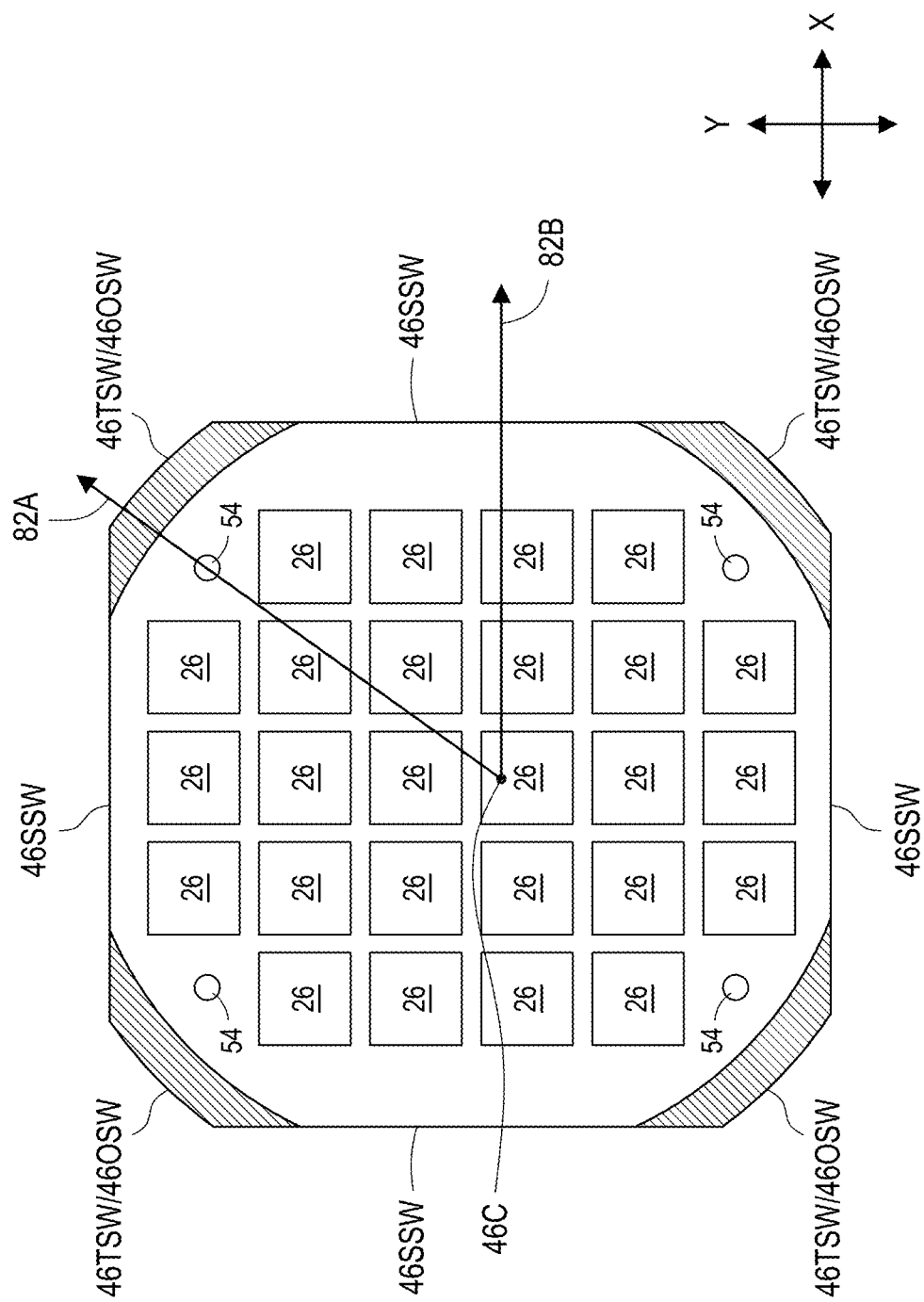

In accordance with some embodiments, three more edge-sawing processes may be performed to remove the top-edge piece, the bottom edge-piece, and the right edge-piece of reconstructed wafer. The top view of the resulting reconstructed wafer 46 is shown in FIG. 13A. It is observed that by removing the edge portions of reconstructed wafer 46, when a plurality of reconstructed wafer 46 are placed side-by-side to form a larger system, the plurality of reconstructed wafer 46 may be placed closer, and the interconnection lines for interconnecting them can be shorter. The sidewalls 46SSW, which are generated by the edge-sawing process, are shown in FIGS. 9 and 13A. In accordance with some embodiments, as shown in FIG. 13A, two of the sidewalls 46SSW are parallel to each other, and are perpendicular to two other sidewalls 46SSW.

Figure 10A:
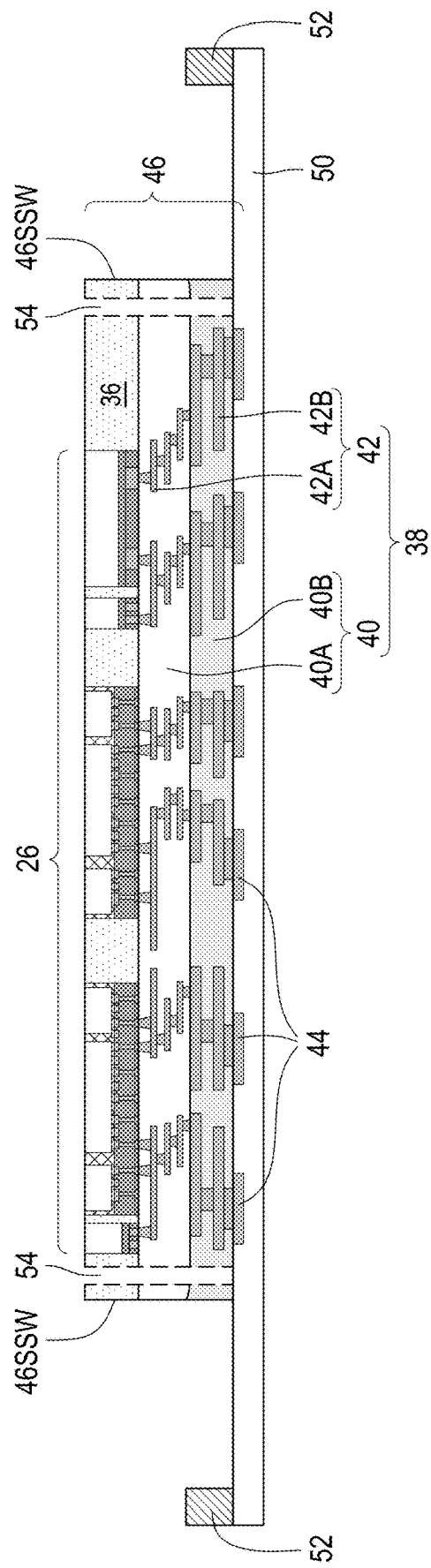
Figure 10B:
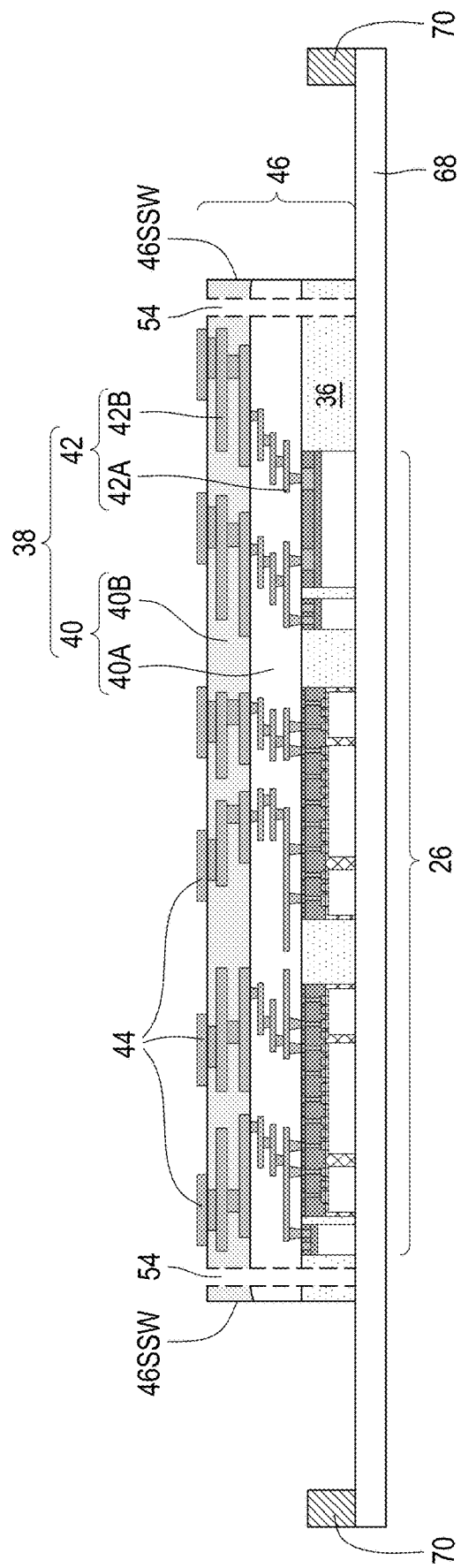

The resulting reconstrued wafer 46 after the sawing process is also shown in FIG. 10A or 10B. FIG. 10A shows the structure where the trimming process is performed with package components 26 facing up, as shown in FIG. 7A. FIG. 10B shows the structure where the trimming process is performed with package components 26 facing down, as shown in FIG. 7B.

Figure 25:
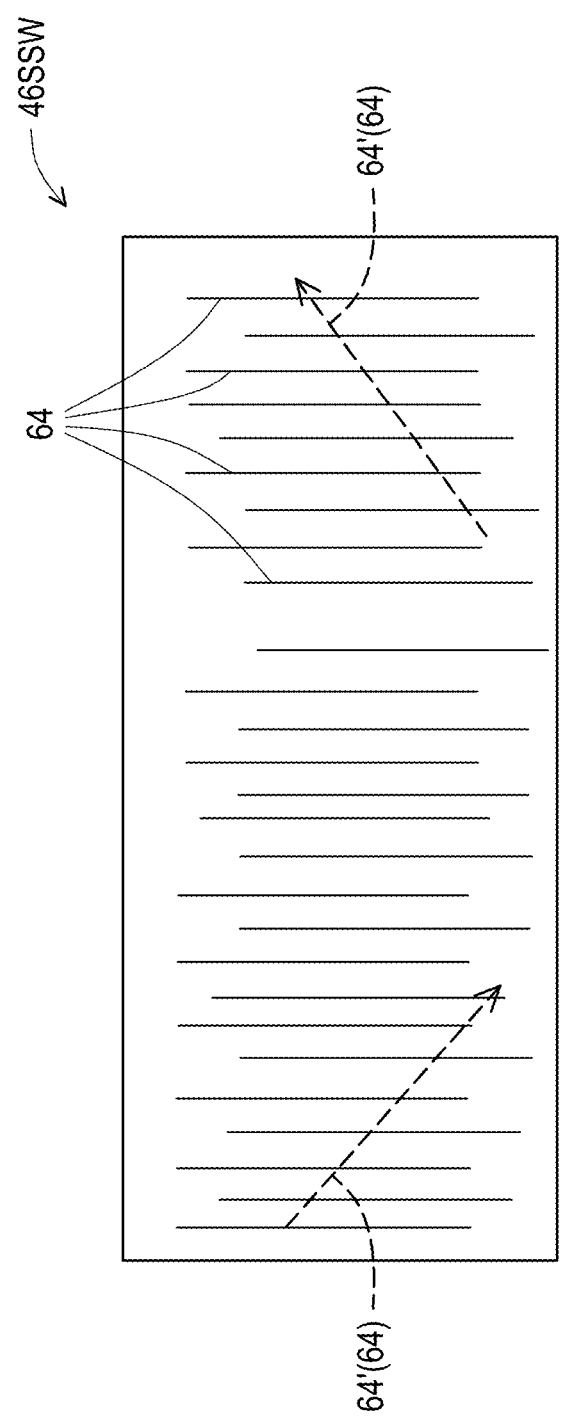
FIG. 25 illustrates sawing marks (traces) on a wafer sidewall formed by a sawing process in accordance with some embodiments.

FIG. 25 illustrates a front view of sidewall 46SSW, which is formed as a result of the edge-sawing process. Since reconstructed wafer 46 is kept still in the edge-sawing process, while there are marks/traces 64 left on the sidewall 46SSW, which traces 64 are the recesses or protrusion on sidewall 46SSW. The traces 64 are the results of the grits on the surface of edge-sawing blade 62, which grits are used for sawing reconstructed wafer 46. Some of the traces 64 may be vertical, and are perpendicular to the top surface of reconstructed wafer 46. Some other traces 64 may be slanted, and may be parallel to the schematically illustrated slanted lines 64'.

Figure 13B:
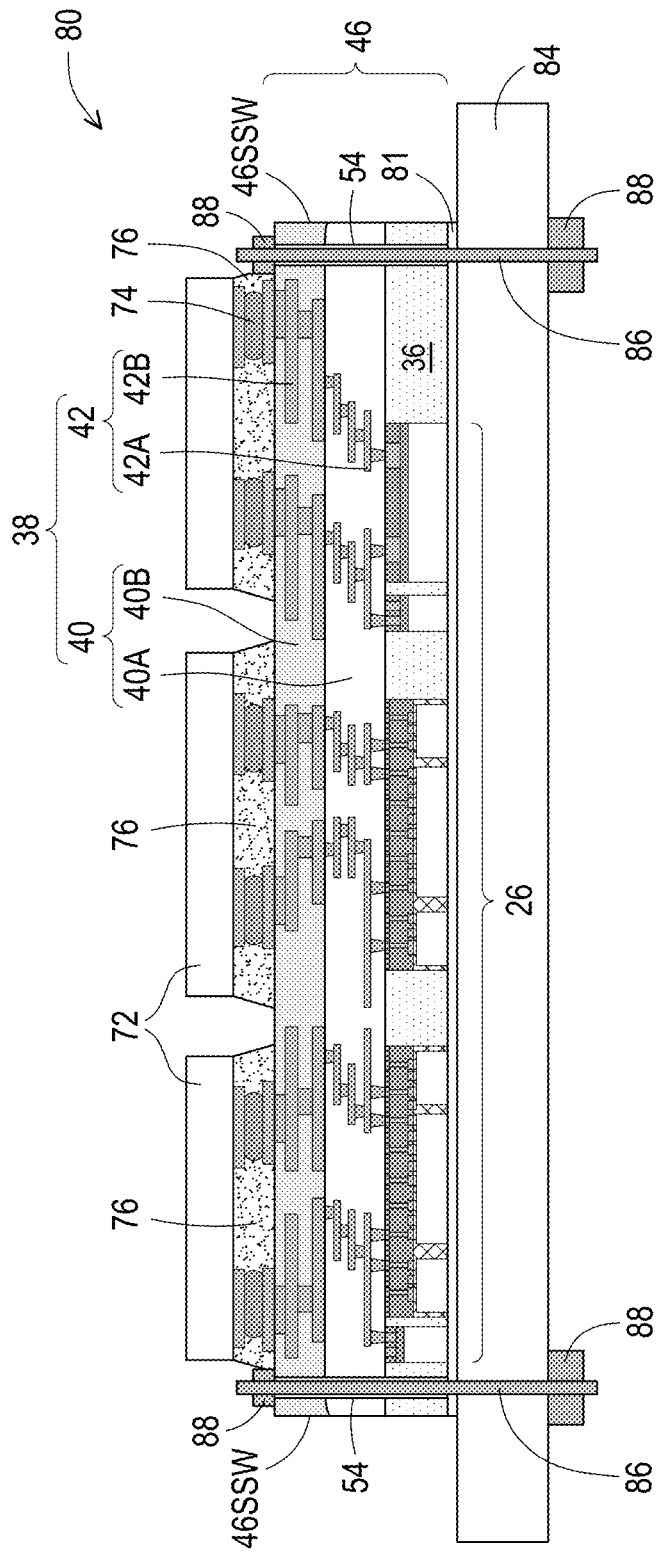

Comparing FIGS. 23 and 25, it is observed that traces 60 and 64 extend in different directions. FIG. 13A illustrates the top view of reconstructed wafer 46, in which both of sidewalls 46TSW, which are caused by the trimming process, and the sidewalls 46SSW, which are formed by the edge-sawing process, are shown. Sidewalls 46TSW fit a circle having center 46C, and center 46C is also the rotation center of reconstructed wafer 46 when the trimming process is performed. Sidewalls 46SSW are straight sidewalls in the top view. Sidewalls 46SSW are also straight-and-vertical sidewalls when viewed in the cross-sectional view as shown in FIG. 13B.

It is appreciated that although the sawing process is illustrated a being performed after the trimming process, in accordance with alternative embodiments, the sawing process may be performed before the trimming process, and the resulting reconstructed wafer 46 is essentially the same as shown in FIG. 10A or 10B.

Figure 11:
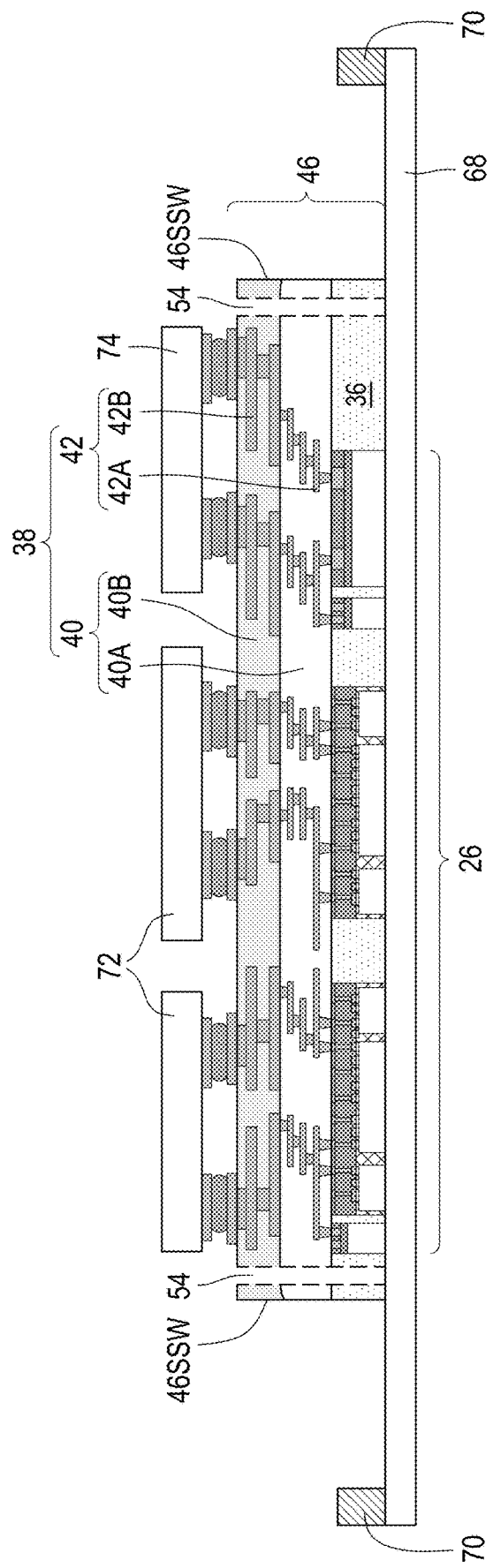

Next, reconstructed wafer 46, which has the top view as shown in FIG. 13A, is removed from tape 50. Referring to FIG. 11, reconstructed wafer 46 is then flipped upside down, and is re-mounted on tape 68, which is fixed on frame 70. Package components 26 may be in contact with tape 68. In accordance with some embodiments, a pre-solder paste (not shown) may be applied on electrical connectors 44 for the subsequent bonding process.

Further referring to FIG. 11, a plurality of package components 72 and 74 are bonded to reconstructed wafer 46. The respective process is illustrated as process 218 in the process flow 200 as shown in FIG. 26. Device dies 72 may include power modules, which may be Voltage-Regulation Modules (VRMs). The power modules may include Pulse Width Modulation (PWM) circuits for regulating power and/or other types of power management circuits. The power modules may provide the regulated power to the underlying package components 26. The power modules may also be connected to the IPD dies in package components 26 for power management and power storage. The power modules may receive power sources (such as AC power source), for example, through connection lines (which connection lines may be over and connected to the power modules). The power sources and connection lines are not illustrated.

Connectors 74, which are used for the signal connection of the resulting system package to other package components, are also bonded to reconstructed wafer 46. Connectors 74 may include adaptors, sockets, or the like. Connectors 74 may include a plurality of signal paths, such as a plurality of pins, pin holes, or the like, and may be used as a bus(es) for parallel or serial signal transmissions between reconstructed wafer 46 and other systems. For example, conductive wires may be connected to connectors 74, and are used to connect reconstructed wafer 46 to other systems.

Figure 12:
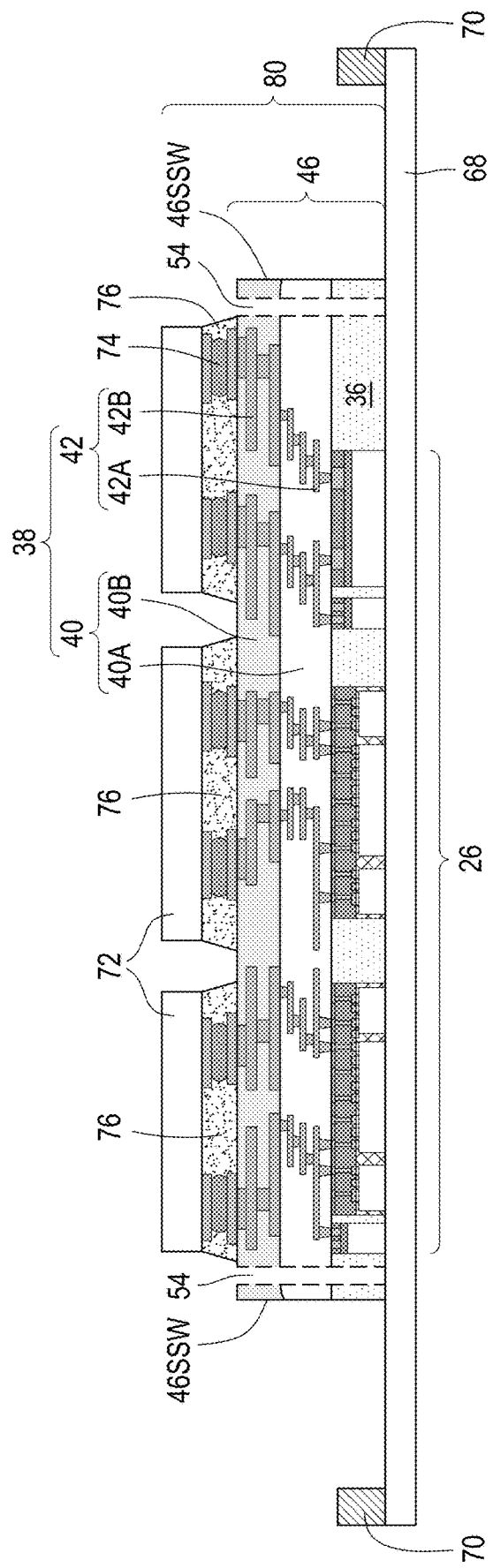

Referring to FIG. 12, underfill 76 may be dispensed into the gaps between reconstructed wafer 46 and device dies 72. The respective process is illustrated as process 220 in the process flow 200 as shown in FIG. 26. The resulting structure is referred to as wafer-form package 80. Underfill 76 may be (or may not be) dispensed into the gaps between connectors 74 and reconstructed wafer 46, depending on the design of connectors 74. Tape 68 and frame 70 may then be detached from wafer-form package 80.

FIG. 13A illustrates a top view of wafer-form package 80, wherein reconstructed wafer 46 and the package components 26 therein are illustrated schematically, while other features are not shown. Arrow 82A represents a cross section in which the trimmed portions remain, and the cross section crosses one of the sidewalls 46TSW generated by trimming process. The respective cross-sectional view of reconstructed wafer 46 may be found in FIG. 7A or 7B. Cross-section 82B extends to a sidewall 46SSW formed by an edge-sawing process. The extending direction of cross-section 82B extends is shown as X-direction.

Figure 13C:
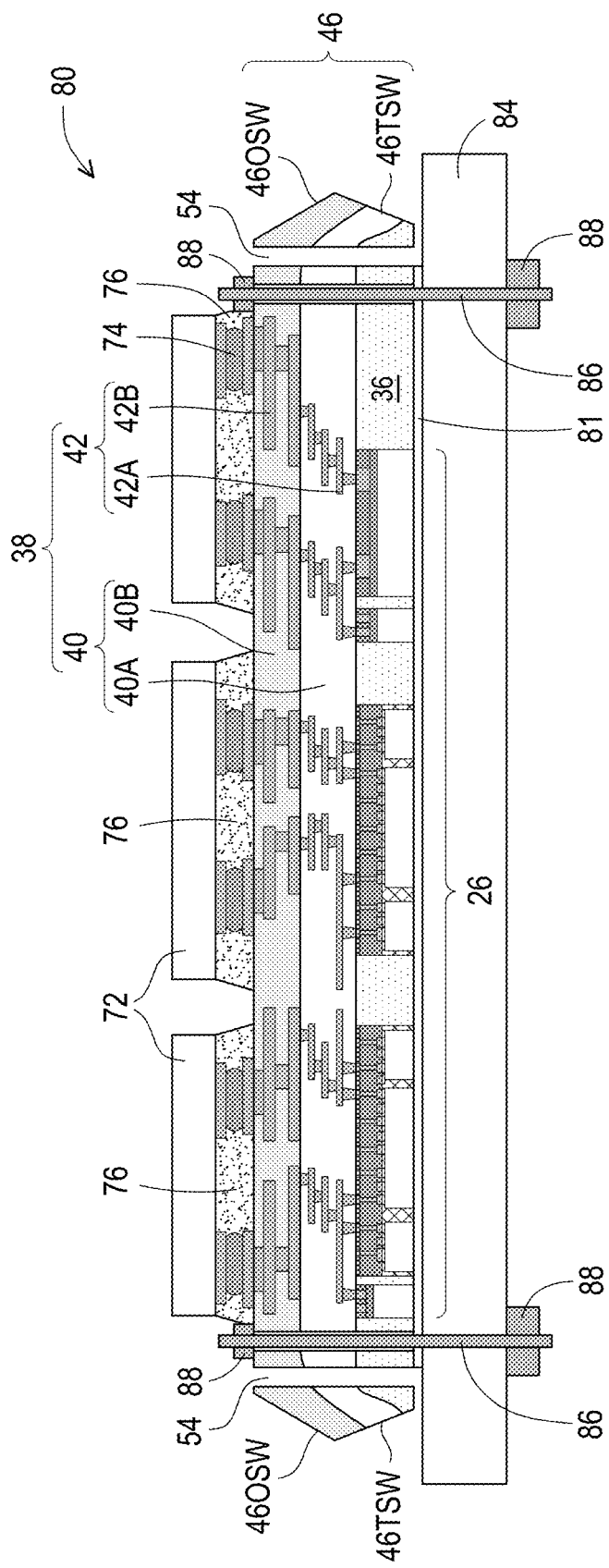

FIGS. 13B and 13C illustrate the cross-sectional views of wafer-form package 80 in accordance with some embodiments. FIG. 13B illustrates the cross-sectional view obtained along cross-section 82B in FIG. 13A, and FIG. 13C illustrates the cross section 82A in FIG. 13A, which may be neither parallel to nor perpendicular to the X-direction and Y-direction. Heat sink 84 may be attached to reconstructed wafer 46 through Thermal Interface Material (TIM) 81, which is an adhesive film having good thermal conductivity. The respective process is illustrated as process 222 in the process flow 200 as shown in FIG. 26. Heat sink 84 may be formed of a metallic material such as copper, aluminum, stainless steel, nickel, or the like. Screws 88 and bolts 86 are in combination used for securing reconstructed wafer 46 and heat sink 84.

Figure 27:
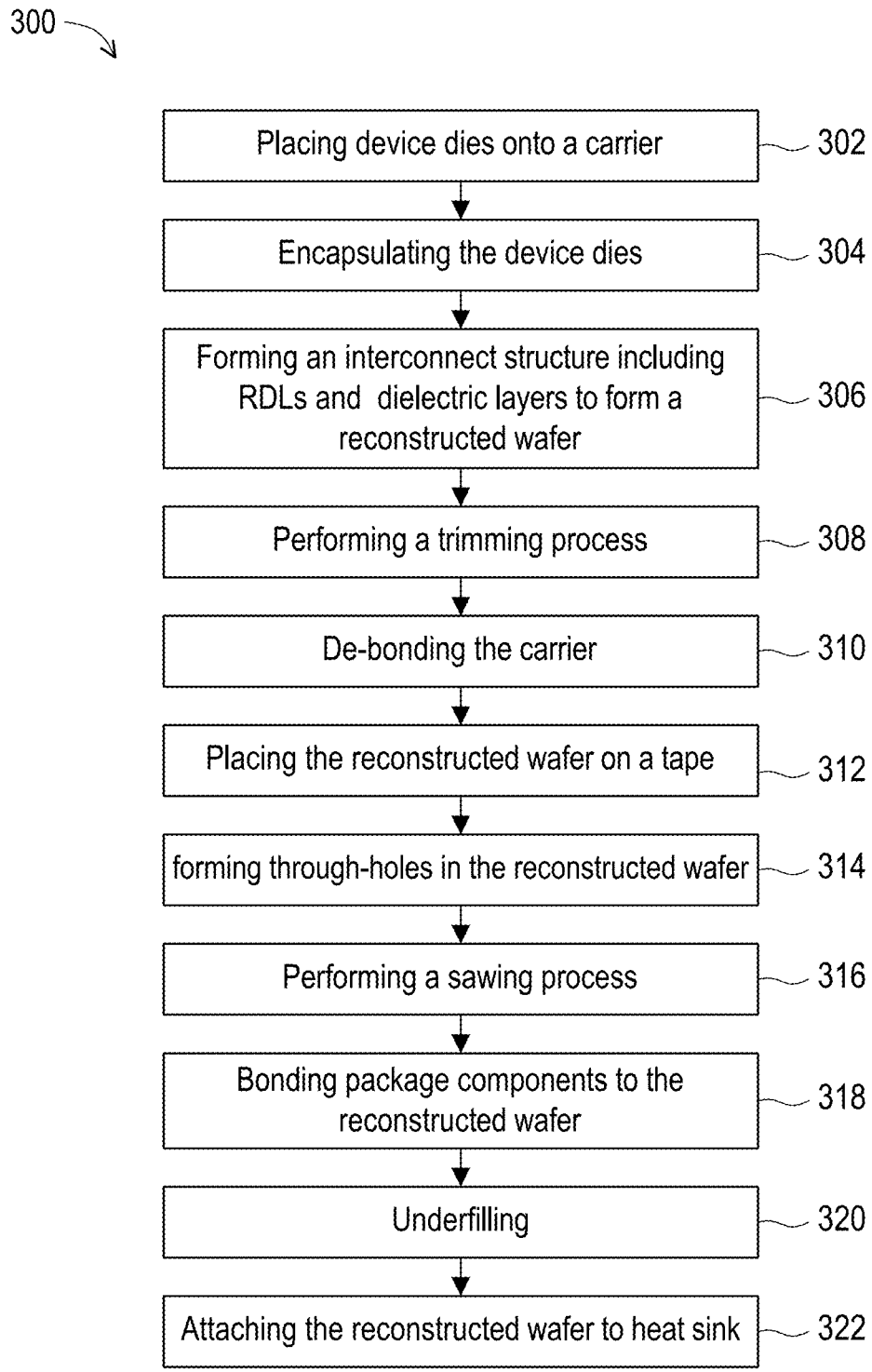

FIGS. 14 through 20 illustrate the cross-sectional views of intermediate stages in the formation of wafer-form package 80 in accordance with alternative embodiments. The corresponding processes are also reflected schematically in the process flow 300 as shown in FIG. 27. These embodiments are similar to the preceding embodiments, except that the trimming process, instead of being performed when the reconstructed wafer 46 is mounted on a tape, is performed when the reconstructed wafer 46 is still on carrier 20. Unless specified otherwise, the materials and the formation processes of the components in these embodiments are essentially the same as the like components denoted by like reference numerals in the preceding embodiments. The details regarding the formation process and the materials of the components shown in FIGS. 14 through 20 may thus be found in the discussion of the preceding embodiments.

Figure 14:
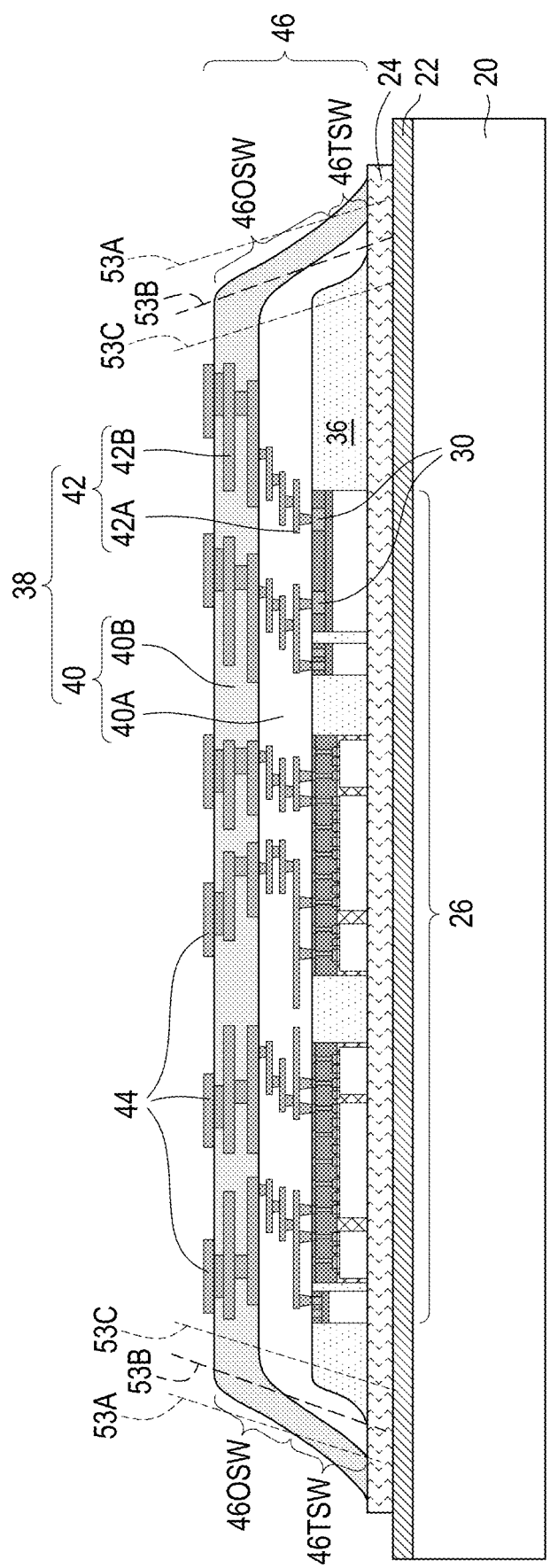
FIGS. 14-20 illustrate the cross-sectional views of intermediate stages in the formation of a wafer-form package in accordance with some embodiments.

The initial processes of these embodiments are essentially the same as shown in FIGS. 1-3, 4A, and 4B. The respective processes are illustrated as processes 302, 304, and 306 in the process flow 300 as shown in FIG. 27. Reconstructed wafer 46 is thus formed on carrier 20. The resulting reconstructed wafer 46 is shown in FIG. 14, which structure is the same as the structure shown in FIG. 4A.

Figure 15:
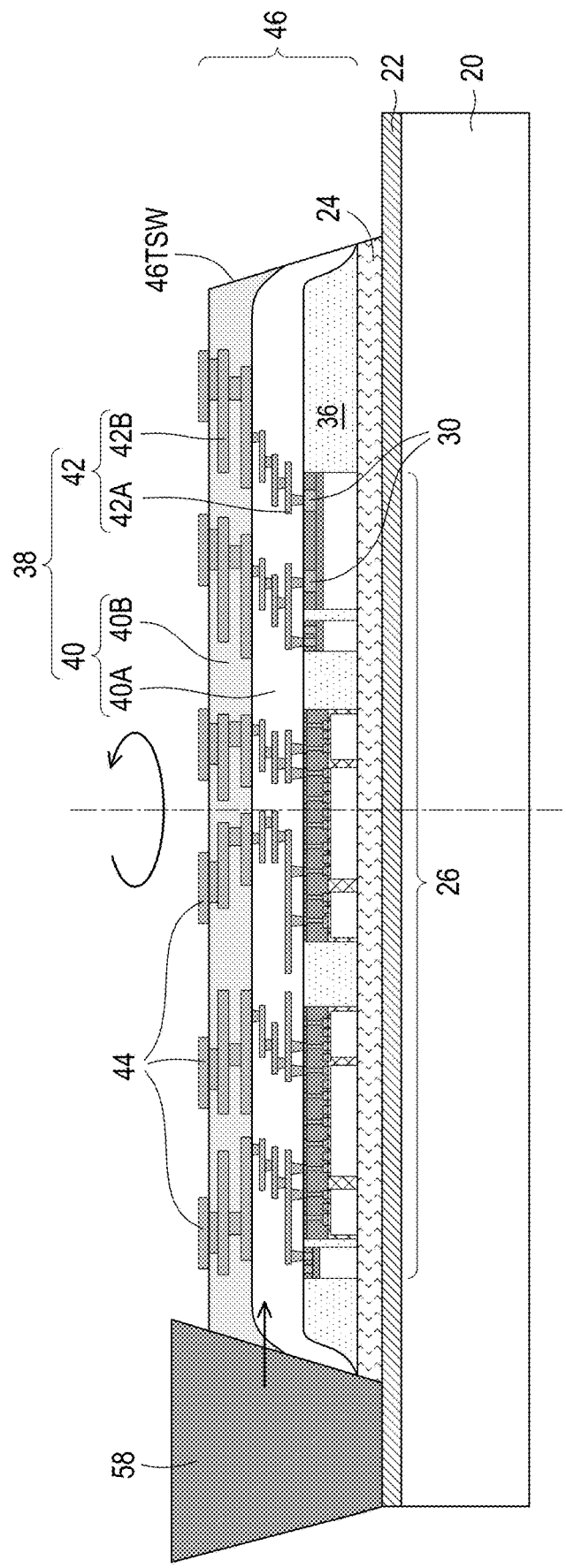
Figure 16:
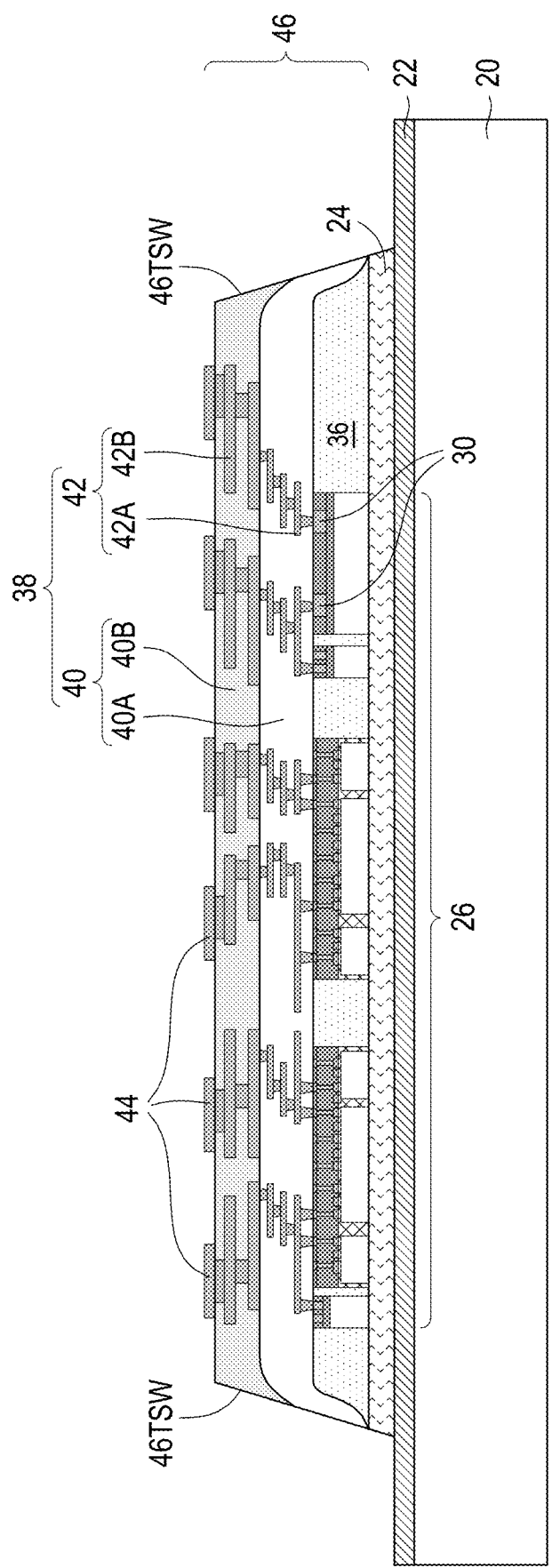

Next, as shown in FIG. 15, reconstructed wafer 46 along with the underlying carrier 20 are placed on chuck table 56 (which is shown in FIGS. 21 and 22), and a trimming process is performed. The respective process is illustrated as process 308 in the process flow 300 as shown in FIG. 27. The trimming process is essentially the same as discussed referring to FIGS. 21 and 22 and FIGS. 7A and 7B, and the details are not repeated herein. In accordance with some embodiments, as shown in FIG. 15, the portions of DAF 24 extending laterally beyond the edges of reconstructed wafer 46 are removed, and some edge portions of dielectric layers 40B, 40A, and possibly encapsulant 36 are also removed. Some stopping positions of the trimming process are shown in FIG. 14 using dashed lines 53A, 53B, and 53C. FIG. 16 illustrates a resulting structure. The trimmed sidewalls 46TSW are thus generated.

In accordance with some embodiments, encapsulant 36 is not exposed after the trimming process. The original sidewalls of dielectric layers 40B may be partially removed, and the respective trimming position is shown by dashed lines 53A. Accordingly, the sidewalls of the trimmed reconstructed wafer 46 has an upper portion and a lower portion. The lower portion of the trimmed sidewalls 46TSW has the horizontal traces as shown in FIG. 23. The upper portion 46OSW of the reconstructed wafer 46 is not trimmed, and has no traces. In accordance with alternative embodiments, the dielectric layers 40A are partially trimmed, with the corresponding trimming positions being shown by dashed lines 53B or dashed lines 53C. The entirety of the sidewalls of trimmed reconstructed wafer 46 may thus be the trimmed sidewalls 46TSW, which includes horizontal traces therein.

Figure 17:
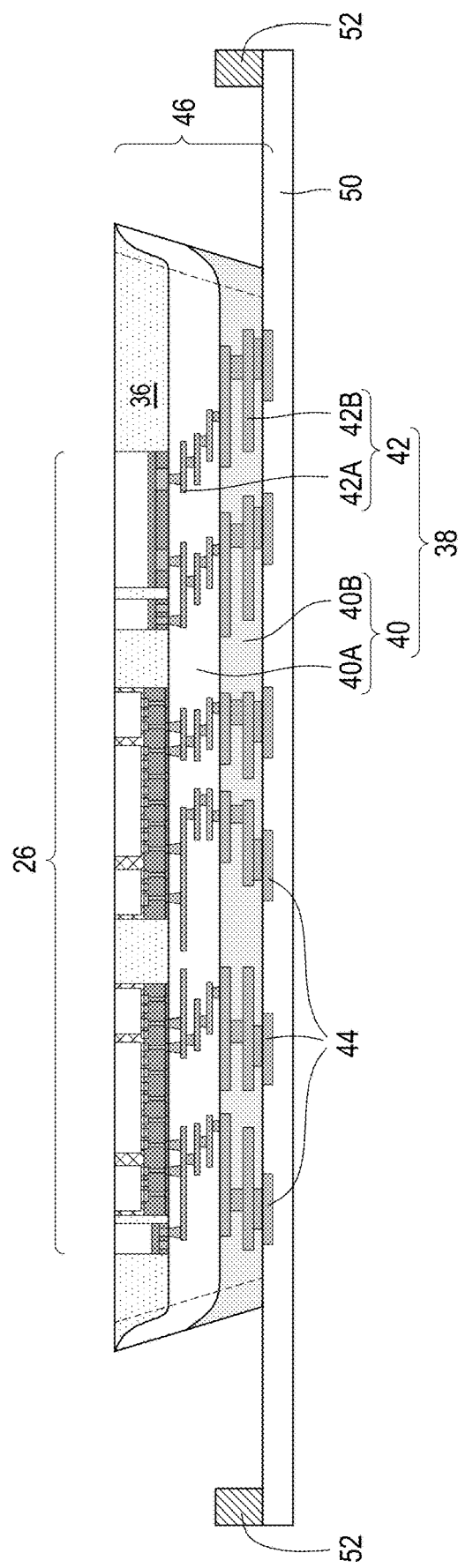

In a subsequent process, carrier 20 is de-bonded from reconstructed wafer 46. The respective process is illustrated as process 310 in the process flow 300 as shown in FIG. 27. The de-bonding may be performed, for example, by projecting a light beam (such as a laser beam) on release film 22, and the light beam penetrates through the transparent carrier 20. The release film 22 is thus decomposed, and reconstructed wafer 46 is released from carrier 20. DAF 24 may be removed in a cleaning process or a grinding process. In accordance with some embodiments, reconstructed wafer 46 is flipped upside down, and is placed on tape 50, which is attached to frame 52, as shown in FIG. 17. The electrical connectors 44 are in contact with tape 50. The respective process is illustrated as process 312 in the process flow 300 as shown in FIG. 27.

Figure 18:
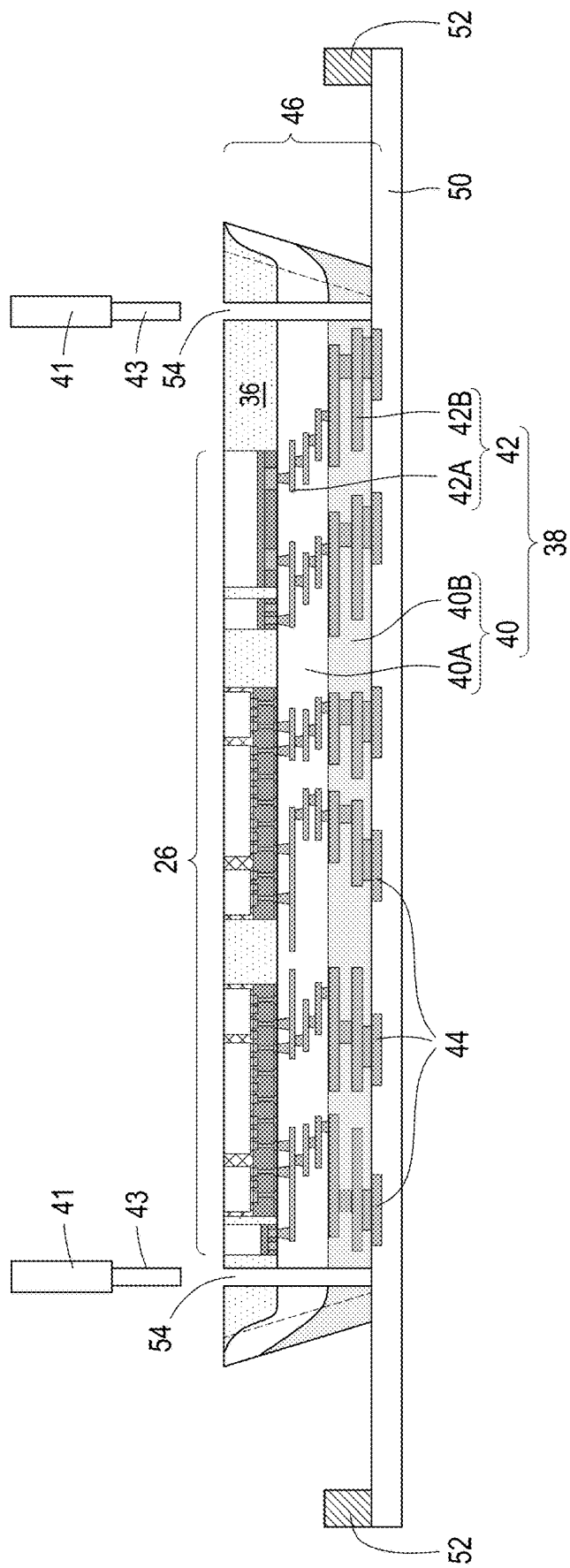

Referring to FIG. 18, through-holes 54 are formed to penetrate through reconstructed wafer 46. Through-holes 54 may be formed through laser drill, drilling using a drill bit, or the like. The respective process is illustrated as process 314 in the process flow 300 as shown in FIG. 27.

Figure 19:
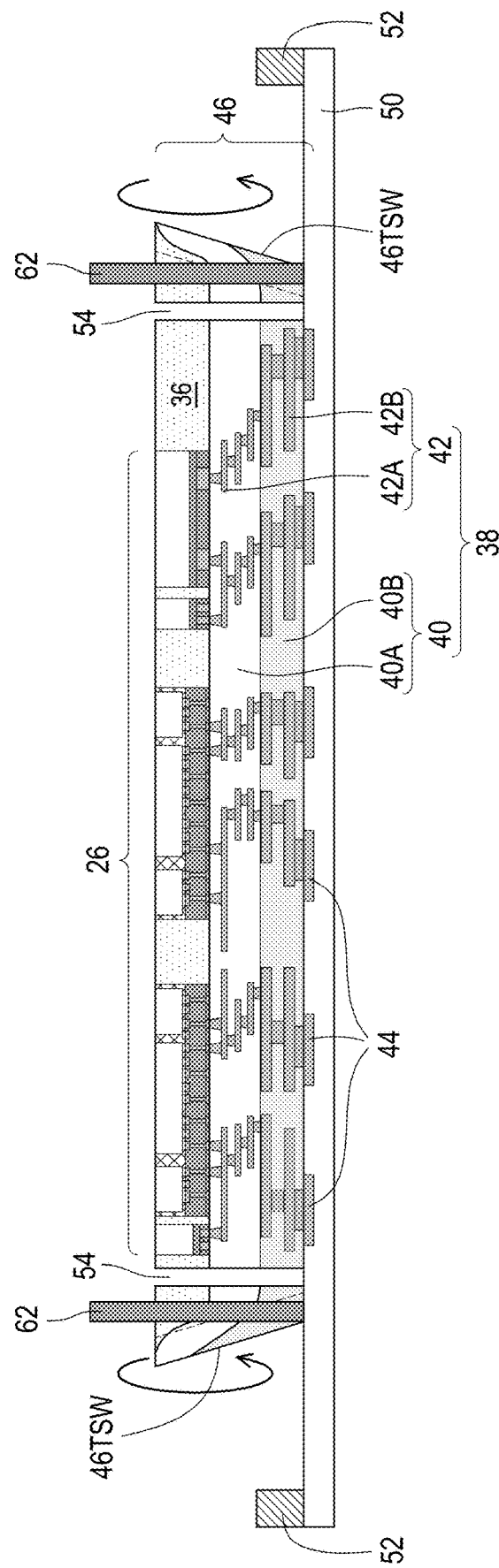
Figure 20:
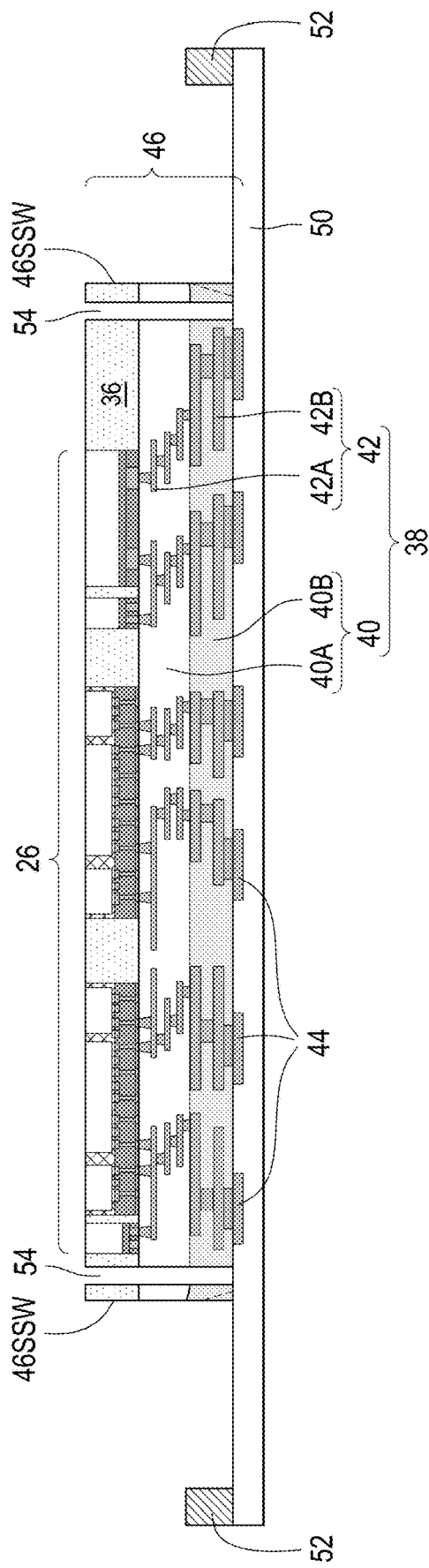

FIG. 19 illustrates an edge-sawing process to remove some edge portions of reconstructed wafer 46, which sawing process is also shown in FIG. 24. The respective process is illustrated as process 316 in the process flow 300 as shown in FIG. 27. In the edge-sawing process, reconstructed wafer 46 is kept still, and is not rotated. A sawing blade 62, which is rotated relative to a horizontal axis, is used to saw reconstructed wafer 46. FIG. 20 illustrates a cross-sectional view of the reconstructed wafer 46 after the edge-sawing process, wherein the cross-sectional view is obtained from the cross section 82B in FIG. 13A (except through-holes 54 are shown also). The traces of sidewalls 46SSW may have the traces as shown in FIG. 25.

The subsequent processes, structures, and materials involved are essentially the same as shown in FIGS. 11, 12, 13A, 13B, and 13C. The respective processes are illustrated as processes 318, 320, and 322 in the process flow 300 as shown in FIG. 27. The resulting structures are also essentially the same as shown in FIGS. 13A, 13B, and 13C. The details of these processes, structures, and materials are not repeated herein, and may be found referring to the preceding embodiments.

In above-discussed embodiments, the trimming and the sawing of reconstructed wafers are used as an example to discuss the concept of the embodiments. In accordance with other embodiments, the edge-trimmed and edge-sawed wafers may be other types of wafers such as semiconductor wafers, which instead of having discrete device dies that are molded in an encapsulant, will have an unsawed semiconductor wafer. Alternatively stated, the semiconductor substrates in the device dies of the unsawed semiconductor wafer continuously extend throughout the entire wafer.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. In order to reduce the occupied areas of large systems including wafer-form packages, the edges of the wafers in the wafer-form packages are sawed, so that the wafers may be placed closer to each other, and the connection lines interconnecting the wafer-form packages may be shortened. The sawing process, however, will neither generate the chamfers nor expose the sidewalls of the plurality of dielectric layers in the un-sawed parts of the wafer-form packages. This may cause quality check issues. In accordance with some embodiments of the present disclosure, both of a trimming process and an edge-sawing process are performed. The traces generated by the trimming process and edge-sawing process are also distinguishable due to their different extending directions.

In accordance with some embodiments of the present disclosure, a method comprises forming a reconstructed wafer comprising placing a plurality of device dies over a carrier; encapsulating the plurality of device dies in an encapsulant; and forming a redistribution structure over the plurality of device dies and the encapsulant, wherein the redistribution structure comprises a plurality of dielectric layers and a plurality of redistribution lines in the plurality of dielectric layers; performing a trimming process on the reconstructed wafer, wherein the trimming process forms a round edge for the reconstructed wafer; and performing a sawing process on the reconstructed wafer, so that the reconstructed wafer comprises straight edges.

In an embodiment, after both of the trimming process and the sawing process, the reconstructed wafer comprises a plurality of round edges and a plurality of straight edges located alternatingly. In an embodiment, the method further comprises de-bonding the reconstructed wafer from the carrier; and placing the reconstructed wafer on a tape, wherein the trimming process and the sawing process are performed when the reconstructed wafer is on the tape. In an embodiment, the method further comprises de-bonding the reconstructed wafer from the carrier, wherein the trimming process is performed when the reconstructed wafer is on the carrier; and placing the reconstructed wafer on a tape, wherein the sawing process is performed when the reconstructed wafer is on the tape. In an embodiment, the method further comprises forming a plurality of through-holes penetrating through the reconstructed wafer.

In an embodiment, the trimming process forms a circular chamfer on the round edge. In an embodiment, the method further comprises bonding an additional plurality of device dies to the reconstructed wafer; and attaching a heat sink to the reconstructed wafer. In an embodiment, the trimming process generates a first plurality of traces on the round edge of the reconstructed wafer, and the sawing process generates a second plurality of traces on the straight edges generated by the sawing process, and wherein the first plurality of traces extend in a direction different from a second direction of the second plurality of traces. In an embodiment, the trimming process is performed by rotating the reconstructed wafer, with a trimming blade used for the trimming process being kept still.

In an embodiment, the sawing process is performed with the reconstructed wafer being kept still, with a sawing blade being moved in a straight line to cut the reconstructed wafer. In an embodiment, the plurality of dielectric layers cover an entirety of the encapsulant, and after the trimming process, a sidewall of the encapsulant is exposed. In an embodiment, the trimming process is performed using a trimming blade having a tilted edge, and the sawing process is performed using a sawing blade having a vertical edge.

In accordance with some embodiments of the present disclosure, a package comprises a reconstructed wafer comprising a plurality of device dies; an encapsulant encapsulating the plurality of device dies therein; a redistribution structure over and electrically connecting to the plurality of device dies; a plurality of curved edges, wherein each of the plurality of curved edges is straight when viewed in a corresponding side view of the reconstructed wafer; and a plurality of straight edges, wherein the plurality of curved edges and the plurality of straight edges are located alternatingly.

In an embodiment, the plurality of curved edges form a plurality of chamfers. In an embodiment, the plurality of curved edges have horizontal traces parallel to a top surface of the reconstructed wafer. In an embodiment, the plurality of straight edges have traces running in directions different from a running direction of the horizontal traces. In an embodiment, the redistribution structure comprises a dielectric layer, and in an edge region of the reconstructed wafer, the dielectric layer extends to a level lower than a top surface of the encapsulant, and wherein one of the plurality of curved edges comprises a sidewall of an exposed portion of the encapsulant.

In accordance with some embodiments of the present disclosure, a package comprises a reconstructed wafer comprising a plurality of device dies; an encapsulant encapsulating the plurality of device dies therein; a redistribution structures over and electrically connecting to the plurality of device dies; and sidewalls comprising a first portion comprising a first plurality of traces extending in a first direction parallel to a top surface of the reconstructed wafer; and a second portion comprising a second plurality of traces extending in a second direction different from the first direction.

In an embodiment, the second direction is perpendicular to the first direction. In an embodiment, the sidewalls comprise a first plurality of portions, wherein the first plurality of portions have traces extending in first directions parallel to the top surface of the reconstructed wafer; and second plurality of portions, wherein the second plurality of portions have traces extending in second directions unparallel to the top surface of the reconstructed wafer, and wherein the first plurality of portions and the second plurality of portions are located alternatingly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a reconstructed wafer comprising:
      placing a plurality of device dies over a carrier;
      encapsulating the plurality of device dies in an encapsulant; and
      forming a redistribution structure over the plurality of device dies and the encapsulant, wherein the redistribution structure comprises a plurality of dielectric layers and a plurality of redistribution lines in the plurality of dielectric layers;
   performing a trimming process on the reconstructed wafer, wherein the trimming process forms a round edge for the reconstructed wafer; and
   performing a sawing process on the reconstructed wafer, so that the reconstructed wafer comprises straight edges.

2. The method of claim 1, wherein after both of the trimming process and the sawing process, the reconstructed wafer comprises a plurality of round edges and a plurality of straight edges located alternatingly.

3. The method of claim 1 further comprising:
   de-bonding the reconstructed wafer from the carrier; and
   placing the reconstructed wafer on a tape, wherein the trimming process and the sawing process are performed when the reconstructed wafer is on the tape.

4. The method of claim 1 further comprising:
   de-bonding the reconstructed wafer from the carrier, wherein the trimming process is performed when the reconstructed wafer is on the carrier; and
   placing the reconstructed wafer on a tape, wherein the sawing process is performed when the reconstructed wafer is on the tape.

5. The method of claim 1 further comprising:
   forming a plurality of through-holes penetrating through the reconstructed wafer.

6. The method of claim 1, wherein the trimming process forms a circular chamfer on the round edge.

7. The method of claim 1 further comprising:
   bonding an additional plurality of device dies to the reconstructed wafer; and attaching a heat sink to the reconstructed wafer.

8. The method of claim 1, wherein the trimming process generates a first plurality of traces on the round edge of the reconstructed wafer, and the sawing process generates a second plurality of traces on the straight edges generated by the sawing process, and wherein the first plurality of traces extend in a direction different from a second direction of the second plurality of traces.

9. The method of claim 1, wherein the trimming process is performed by rotating the reconstructed wafer, with a trimming blade used for the trimming process being kept still.

10. The method of claim 1, wherein the sawing process is performed with the reconstructed wafer being kept still, with a sawing blade being moved in a straight line to cut the reconstructed wafer.

11. The method of claim 1, wherein the plurality of dielectric layers cover an entirety of the encapsulant, and after the trimming process, a sidewall of the encapsulant is exposed.

12. The method of claim 1, wherein the trimming process is performed using a trimming blade having a tilted edge, and the sawing process is performed using a sawing blade having a vertical edge.

13. A method comprising:
forming a reconstructed wafer comprising:
encapsulating a plurality of device dies in an encapsulant;
forming a redistribution structure over and electrically connecting to the plurality of device dies;
trimming the encapsulant and the redistribution structure to form a plurality of curved edges, wherein each of the plurality of curved edges is straight when viewed in a corresponding side view of the reconstructed wafer; and
sawing the encapsulant and the redistribution structure to form a plurality of straight edges, wherein the plurality of curved edges and the plurality of straight edges are located alternatingly.

14. The method of claim 13, wherein the trimming results in the plurality of curved edges form a plurality of chamfers.

15. The method of claim 13, wherein the trimming results in the plurality of curved edges have horizontal traces parallel to a top surface of the reconstructed wafer.

16. The method of claim 15, wherein the sawing results in the plurality of straight edges have traces running in directions different from a running direction of the horizontal traces.

17. The method of claim 16, wherein the redistribution structure comprises a dielectric layer, and in an edge region of the reconstructed wafer, the dielectric layer extends to a level lower than a top surface of the encapsulant, and wherein one of the plurality of curved edges comprises a sidewall of an exposed portion of the encapsulant.

18. A method comprising:
forming a reconstructed wafer comprising:
encapsulating a plurality of device dies in an encapsulant;
forming a redistribution structure over and electrically connecting to the plurality of device dies; and
processing edges of the reconstructed wafer to form sidewalls comprising:
a first portion comprising a first plurality of traces extending in a first direction parallel to a top surface of the reconstructed wafer; and
a second portion comprising a second plurality of traces extending in a second direction different from the first direction.

19. The method of claim 18, wherein the second direction is perpendicular to the first direction.

20. The method of claim 18, wherein the sidewalls comprise:
a first plurality of portions formed by trimming the reconstructed wafer as a first process of the processing, wherein the first plurality of portions have traces extending in first directions parallel to the top surface of the reconstructed wafer; and
a second plurality of portions formed by sawing the reconstructed wafer as a second process of the processing, wherein the second plurality of portions have traces extending in second directions un-parallel to the top surface of the reconstructed wafer, and wherein the first plurality of portions and the second plurality of portions are located alternatingly.

* * * * *